(12) United States Patent
Takahashi et al.

(10) Patent No.: US 7,006,401 B2
(45) Date of Patent: Feb. 28, 2006

(54) SEMICONDUCTOR STORAGE DEVICE AND REFRESH CONTROL METHOD THEREOF

(75) Inventors: Hiroyuki Takahashi, Kanagawa (JP); Takuya Hirota, Kanagawa (JP); Noriaki Komatsu, Kanagawa (JP); Atsushi Nakagawa, Kanagawa (JP); Susumu Takano, Kanagawa (JP); Masahiro Yoshida, Kanagawa (JP); Yuuji Torige, Kanagawa (JP); Hideo Inaba, Kanagawa (JP)

(73) Assignee: NEC Electronics Corp., Kanagawa (JP)

( * ) Notice: Subject to any disclaimer, the term of this patent is extended or adjusted under 35 U.S.C. 154(b) by 0 days.

(21) Appl. No.: 10/500,400

(22) PCT Filed: Dec. 25, 2002

(86) PCT No.: PCT/JP02/13555

§ 371 (c)(1),
(2), (4) Date: Jun. 28, 2004

(87) PCT Pub. No.: WO03/056563

PCT Pub. Date: Oct. 7, 2003

(65) Prior Publication Data

US 2005/0047239 A1 Mar. 3, 2005

(30) Foreign Application Priority Data

Dec. 27, 2001 (JP) .............................. 2001-397575

(51) Int. Cl.
*G11C 7/00* (2006.01)

(52) U.S. Cl. .................................. 365/222; 365/189.04

(58) Field of Classification Search ................ 365/222, 365/230.02, 189.04, 189.07, 238.5
See application file for complete search history.

(56) References Cited

U.S. PATENT DOCUMENTS

| 5,999,474 A | * | 12/1999 | Leung et al. ................ 365/222 |
| 6,275,437 B1 | | 8/2001 | Kim et al. |
| 6,415,353 B1 | * | 7/2002 | Leung .......................... 365/222 |
| 2002/0159318 A1 | | 10/2002 | Arimoto et al. |

FOREIGN PATENT DOCUMENTS

| EP | 0 273 652 A2 | 7/1988 |
| EP | 1 291 880 A1 | 3/2003 |
| JP | 61-5495 | 1/1986 |

(Continued)

*Primary Examiner*—Thong Q. Le
(74) *Attorney, Agent, or Firm*—Muirhead and Saturnelli, LLC

(57) ABSTRACT

Refresh of memory cells is performed periodically by a refresh timer, and collision between memory access and memory refresh is avoided. When memory access occurs, an F/F 163 is set by a one shot pulse from an OS circuit 161, a memory access request is inputted to a memory accessing pulse generator circuit 171 through a NOR gate 167, and a latch control signal LC and an enable signal REN are outputted. When a refresh request from the refresh timer is inputted to an AND gate 168 during the memory access, the output of the NOR gate 167 is at the "L" level, and the refresh request is blocked by the AND gate 168. Thereafter, at the time when the latch control signal LC is turned into the "L" level, F/Fs 163, 164 and 165 are reset, the output of the NOR gate 167 is turned into the "H" level, the refresh request is inputted to a refreshing pulse generator circuit 170, and a refresh enable signal RERF is outputted.

18 Claims, 17 Drawing Sheets

FOREIGN PATENT DOCUMENTS

| | | |
|---|---|---|
| JP | 62-188096 | 8/1987 |
| JP | 63-155494 A | 6/1988 |
| JP | 63-206994 | 8/1988 |
| JP | 2-187987 A | 7/1990 |
| JP | 4-243087 | 8/1992 |
| JP | 6-36557 | 2/1994 |
| JP | 2001-105837 | 4/2001 |
| JP | 2001-357670 A | 12/2001 |
| JP | 2001-357671 | 12/2001 |
| JP | 2001-357671 A | 12/2001 |
| WO | WO 01/78079 | 10/2001 |

* cited by examiner

SEMICONDUCTOR STORAGE DEVICE AND REFRESH CONTROL METHOD THEREOF

TECHNICAL FIELD OF THE INVENTION

The present invention relates to a semiconductor memory device having a memory cell array constituted by a DRAM and configured to operate according to specifications similar to those of a general purpose SRAM when seen from outside of the semiconductor memory device, and a refresh control method thereof.

BACKGROUND ART

Typical random accessible semiconductor memories include SRAMs and DRAMs. The SRAM performs a read/write operation at a high speed compared with the DRAM, and requires no refresh operation unlike the DRAM, and therefore the SRAM has an advantage that it can easily be handled and a data holding current in a stand-by state is low, but six transistors are required per memory cell for forming the SRAM, and therefore the SRAM has a disadvantage that its chip size increases and thus the cost is increased, compared with the DRAM.

On the other hand, the memory cell of the DRAM can be formed by one capacitor and one transistor, thus allowing a large capacity memory to be constituted with a small chip size, and the DRAM is cheaper than the SRAM if semiconductor memories having the same memory capacity are formed. However, since the DRAM gives a row address and a column address separately as addresses and thus requires a RAS (row address strobe) signal and a CAS (column address strobe) signal as signals specifying timing of capturing the addresses, and requires a control circuit for refreshing the memory cell on a regular basis, the DRAM has a disadvantage that timing control is complicated and current consumption increases compared with the SRAM.

Currently, the dominating semiconductor memory device employed in portable electronic devices represented by cellular phones and the like is the SRAM. This is because the SRAM is suitable for cellular phones for which it is desired that continuous call time and continuous standby time should be prolonged as much as possible because of the low standby current and low power consumption, the conventional cellular phone does not require a very large capacity semiconductor memory device because it is equipped with only simple features, the SRAM is easily handled in terms of timing control and the like, and so on.

On the one hand, the current cellular phone is equipped with the e-mail send/receive feature and the feature such that a WEB server on the internet is accessed and the contents of a homepage are simplified and displayed, and it can be expected that in the future, the home page and the like on the internet can be freely accessed like the current personal computer and the like. For realizing such features, graphic display for providing a variety of multimedia information to a user will be prerequisite, and it will be required that a large capacity semiconductor memory device should be provided for temporarily storing mass data received from a public network and the like in the cellular phone.

On the other hand, the portable electronic device is required to have a reduced size, a reduced weight and reduced power consumption, and therefore an increase in size, an increase in weight and an increase in power consumption should be avoided while the capacity of the semiconductor memory device is increased. Thus, for the semiconductor memory device mounted on the portable electronic device, the SRAM is preferable if considering ease of handling and power consumption, but the DRAM is preferable in terms of the large capacity. That is, it can be said that a semiconductor memory device having merits of both the SRAM and DRAM is most suitable for the future portable electronic device.

As such a semiconductor memory device, one called "pseudo SRAM" having specifications almost same as the SRAM when seen from outside while using memory cells same as those employed in the DRAM has been proposed (e.g. Japanese Laid-Open Patent Publication No. 61-5495, Japanese Laid-Open Patent Publication No. 62-188096, Japanese Laid-Open Patent Publication No. 63-206994, Japanese Laid-Open Patent Publication No. 4-243087 or Japanese Laid-Open Patent Publication No. 6-36557).

However, the pseudo SRAM requires the refresh operation to be constantly performed for holding data stored in memory cells because the memory cell itself is identical to that of the DRAM. Thus, for example, in the pseudo SRAM described in Japanese Laid-Open Patent Publication No. 4-243087 or Japanese Laid-Open Patent Publication No. 63-206994, if a read or write request is made from outside, refresh is first performed, and then read or write of memory cells matching the read request or write request is performed. Thus, there is a problem such that timing of the operation of read or write of memory cells is delayed by time required for the refresh operation.

Furthermore, the pseudo SRAM described in the above Japanese Laid-Open Patent Publication No. 61-5495, Japanese Laid-Open Patent Publication No. 62-188096 or Japanese Laid-Open Patent Publication No. 6-36557 comprises a timer for refresh therein, wherein a refresh start request is made at the time when a predetermined time period elapses, and refresh is performed after completion of read, and thus the time delay described above never occurs for the reading operation, but there is no description as to timing in which a write enable signal determining write timing is given, and the following problem arises in the case of the write operation.

That is, if the pseudo SRAM is to be operated in specifications same as those of the general purpose SRAM, the write enable signal and write data are given asynchronously with a change of an address, and therefore the operation of write in a memory cannot be actually started until the enable signal and write data are both determined even if the write address is determined. That is, vacant time during which no operation is performed is spent until the write enable signal and write data are determined, and write and refresh are performed in sequence only after the write enable signal and write data are determined. Thus, there is a disadvantage that a memory cycle is prolonged by the vacant time, compared with the configuration in which refresh is performed and then write is performed.

In terms of solving the problem such that this refresh slows a normal read/write access, the applicant proposed, in Japanese Patent Application No. 2001-105837 (Japanese Laid-Open Patent Publication No. 2001-357671, International Patent Application WO01/78079A1), a semiconductor memory device comprising a memory cell array constituted by memory cells requiring refresh, in which a write request and write data are asynchronously given to an access address, wherein a refresh operation is performed after read or write to the access address is performed, and at a time point after a memory cycle in which the above described write request is given, write using the above described access address and the above described write data given in the memory cycle is performed in late write.

FIG. 1 is a block diagram showing an example of the semiconductor memory device proposed in the Japanese Patent Application 2001-105837, and FIG. 2 is a timing chart showing the late write operation and refresh operation of the semiconductor memory device.

In FIGS. 1 and 2, an address Add is an access address supplied from outside of the semiconductor memory device. The address Add includes a row address and a column address in accordance with an arrangement of a memory cell array 107 in a matrix form. An address buffer 101 buffers and outputs the address Add. A latch 102 outputs directly as an internal address LC-ADD an address supplied from the address buffer 101 as long as a latch control signal LC is at an "L" level (during a time period after the latch control signal LC falls until it rises again). Furthermore, the latch 102 captures the address supplied from the address buffer 101 at the rise of the latch control signal LC, holds the address as long as the latch control signal LC is at a "H" level, and outputs the held address as an internal address LC-ADD.

Control signals LW1 and LW2 supplied from an R/W control circuit 114 to register circuits 103 and 112 are signals for control of the late write signal. The control signals are both set at the "H" level when late write is performed and set at the "L" level otherwise. The register circuit 103 includes therein a register (hereinafter referred to as address register) for holding an access address identical in bit width to the address Add. Thus, if the control signal LW1 is at the "L" level, the register circuit 103 outputs the inputted internal address LC-ADD directly as an internal address L-ADD. On the other hand, if the control signal LW1 id at the "H" level, the register circuit 103 outputs an address held in the address register, other than the internal address LC-ADD, as the internal address L-ADD.

Furthermore, the register circuit 103 captures the internal address LC-ADD in the internal register for next late write at a fall edge of the control signal LW1. Further, the register circuit 103 comprises a comparator comparing the inputted internal address LC-ADD with the address held by the address register on a bit-by-bit basis, and the comparator outputs the "H" level as a hit signal HITS if the former is consistent with the latter in all bits, and outputs the "L" level if they are not consistent with each other in one or more bits. The hit signal HITS is used in a bypass operation for maintaining data coherency seen from outside of the semiconductor memory device.

In late write employed in the semiconductor memory device, write in memory cells is actually performed in the memory cycle after the memory cycle in which the write request is made. That is, in the memory cycle in which the write request is made, the write address and write data are temporarily captured in the address register of the register circuit 103 and a data register of the register circuit 112. Write in the memory cell array 107 is then performed based on the address and data captured in the memory cycle in which the write request is inputted. Thus, if the read request is made for the address for which the write request has been made by the time when write in the memory cell array 107 is actually performed, data is not written in the memory array 107 yet at this time, but exists only in the register circuit 112.

Accordingly, if read from the memory cell array 107 is performed, old data before write is outputted to outside of the semiconductor memory device. In this case, the memory cell array 107 is bypassed and data stored in the register circuit 112 is outputted. For detecting this situation, the internal address LC-ADD is checked against the address resister in the register circuit 103 to detect by the comparator in the register circuit 103 that the read request has been inputted from outside for the address not written yet in the memory cell array 107. An ATD (address transition detector) circuit 104 detects whether the internal address LC-ADD is changed if a chip select signal/CS (symbol "/" means negative logic) is effective (at "L" level).

If a change is observed in one or more bits of the internal address LC-ADD, the ATD circuit 104 generates a positive one shot pulse as an address transition detection signal after a time period corresponding to an address skew period elapses after the time point at which the change is detected. The chip select signal/CS is a select signal enabled when the semiconductor memory device is accessed. In the ATD circuit 104, if bits of the address are changed or the chip select signal/CS is enabled, pulses are generated, and the pulses are combined to generate a one shot pulse. Thus, even if the address ADD has a skew, there is no possibility that a plurality of address transition detection signals are generated. Therefore, there arises no situation in which write in a plurality of memory cells is performed, or read from a plurality of memory cells is performed at a time, resulting in corruption of data in the memory cell.

Furthermore, if the skew is large, the address skew time period is prolonged, generation of the one shot pulse as the address transition detection signal ATD is accordingly delayed, and access time increases but in specifications of the general purpose SRAM, access time has a value based on the time point at which the address Add is determined, and therefore only access time from a bit changed most recently, of bits of the address Add, should be insured, and no operation delay occurs even if access is started after the address skew period elapses. Read or write to the address Add is started at the time when the one shot pulse of the address transition detection signal ATD rises, and then refresh is started at the time when the one shot pulse falls. Accordingly, the pulse width of the one shot pulse of the address transition detection signal ATD is set to at least a time period required for completion of read or write.

Furthermore, the duration of the address skew is matched with the maximum value of skews existing between bits of the address Add and chip select signals/SC, or set to a value slightly larger than the maximum value of the skew for leaving a margin. Because the skew occurs for the reason described above, the maximum value of the skew is estimated and determined in advance based on characteristics of the entire system to which the semiconductor memory device is applied. The refresh control circuit 105 includes therein an address counter (refresh counter) and a refresh timer. The refresh control circuit 105 uses the above counter and timer, the address transition detection signal ATD and the write enable signal/WE to control refresh in the semiconductor memory device, whereby the refresh address and refresh timing are automatically generated in the semiconductor memory device, and refresh similar to self-refresh in the general purpose DRAM is realized.

The address counter sequentially generates refresh address addresses R-ADD for refreshing DRAM memory cells. The refresh address R-ADD has a bit width same as that of the row address included in the address Add. The refresh timer counts time passing after the access request is made from outside of the semiconductor memory device most recently, and it causes self refresh to be started in the semiconductor memory device when the time exceeds a predetermined refresh time period. Accordingly, the refresh timer is configured to be reset and restart counting time each time the address transition detection signal ATD is enabled.

A multiplexer (MUX) 106 selects a row address included in the internal address L-ADD and outputs the same as an address M-ADD if the address transition detection signal AID is at the "H" level and the refresh control signal REFB is at the "H" level, according to the levels of the address transition detection signal ATD and the refresh control signal REFB.

On the other hand, if the address transition detection signal ATD is at the "L" level or the refresh control signal REFB is at the "L" level, the refresh address R-ADD is selected and outputted as the address M-ADD. The memory cell array 107 is a memory cell array similar to that of the general purpose DRAM, wherein word lines and bit lines (or bit line pair) run in row and column directions, respectively, and memory cells each constituted by one transistor and one capacitor like the DRAM are arranged at intersections of the word lines and the bit lines in a matrix form. When a row enable signal RE is at the "H" level, a row decoder 108 decodes the address M-ADD to activate a word line designated by the address M-ADD. When the row enable signal RE is at the "L" level, the row decoder 108 activates none of word lines.

When a column enable signal CE is at the "H" level, a column decoder 109 decodes the column address included in the internal address L-ADD, and generates a column selection signal for selecting a bit line designated by the internal address L-ADD. When the column enable signal/CE is at the "L" level, the column decoder 109 generates no column selection signal corresponding to any of bit lines. A sense amp/precharge circuit 110 is comprised of a sense amp, a column switch and a precharge circuit. The column switch establishes connection between the sense amp designated by the column selection signal outputted by the column decoder 109 and a bus WRB. The sense amp sense-amplifies the potential of the bit line to which the memory cell specified by the address Add is connected, and outputs the same to the bus WRB, or writes write data supplied to the bus WRB in the memory cell through the bit line when a sense amp enable signal SE is at the "H" level.

The precharge circuit pre-charges the potential of the bit line into a predetermined potential (e.g. ½ of power supply potential) when a precharge enable signal PE is at the "H" level. A hit control circuit 111 and a register circuit 112 perform the late write operation in cooperation with the above described register circuit 103. Among them, the hit control signal 111 captures the hit signal HITS at the rise of the address transition detection signal ATD, and sends the signal to the register circuit 112 as the hit enable signal HE. The value of the address Add is not determined within the address skew period, and therefore the hit control circuit 111 captures the hit signal HITS at the time when the address Add is determined. The register circuit 112 includes therein a data register having a bit width same as that of data exchanged on the bus WRB. The register circuit 112 captures write data supplied onto the bus WRB from outside through an I/O buffer 113 into the data register with a fall edge of the control signal LW2 as a trigger.

That is, if a write request is made, write data given in the memory cycle is temporarily captured in the data register, and the captured write data is written in the memory cell array 107 in the memory cycle in which a next write request is made. That is, if the control signal LW2 is at the "H" level, the register circuit 112 outputs the write data given in response to the immediately preceding write request from the data register onto the bus WRB. On the other hand, in the case of the read operation in which the control signal LW2 is at the "L" level, the register circuit 112 performs an operation varying depending on the levels of the hit enable signal HE. That is, if the hit enable signal HE is at the "L" level indicating a miss hit, the register circuit 112 outputs read data on the bus WRB directly onto a bus WRBX.

On the other hand, if the hit enable signal HE is at the "H" level indicating a hit, the register circuit 112 sends write data not written yet in the memory cell array 107 onto the bus WRBX from the data register in the register circuit 112. In this case, data of the memory cell array 107 read onto the bus WRB through the sense amp/precharge circuit 10 is not used. The I/O (input/output) buffer 113 buffers read data on the bus WRBX with an output buffer and outputs the same from a bus I/O to outside of the semiconductor memory device if a control signal CWO from the R/W control circuit 114 is at the "H" level, and it buffers write data supplied from outside of the semiconductor memory device to the bus I/O with an input buffer with the output buffer in a floating state, and sends the same onto the bus WRBX if the control signal CWO is the "L" level. That is, read is performed if the control signal CWO is at the "H" level, and write is performed if the control signal CWO is at the "L" level.

The R/W (read/write) control circuit 114 generates the control signal CWO and control signals LW1 and LW2 based on the chip select signal/CS, the write enable signal/WE and an output enable signal/OE. Late write is performed in the semiconductor memory device but in specifications when seen from outside of the semiconductor memory device, write (capturing) of data is started at the fall edge of the write enable signal/WE, data is determined at the rise edge of the write enable signal/WE, and write (capturing) is completed. A latch control circuit 115 generates the above latch control signal LC determining latch timing of the address Add based on the address transition detection signal ATD and the sense amp enable signal SE. The latch control signal LC is at the "H" level during a period after the rise edge of the address transition detection signal ATD until the fall edge of the sense amp enable signal SE generated during the refresh operation (the address transition detection signal ATD is at the "L" level).

Consequently, even if the address Add changes after the address transition detection signal ATD rises, the latch 102 continuously holds the value of the internal address LC-ADD until the latch control signal LC falls. A row control circuit 116 generates the row enable signal RE, the sense amp enable signal SE, the precharge enable signal PE and a column control signal CC based on refresh control signals REFA and REFB, the address transition detection signal ATD and the write enable signal/WE. The column control circuit 117 generates a column enable signal/CE based on the column control signal/CC. That is, at the time of read or write, the row control circuit 116 generates a positive one shot pulse in the row enable signal RE with the rise of the one shot pulse of the address transition detection signal ATD as a trigger.

Furthermore, if the refresh control signal REFA is at the "H" level, the row control circuit 116 generates a positive one shot pulse, which is required for the refresh operation, in the row enable signal RE with the fall edge of the one shot pulse of the address transition detection signal ATD as a trigger. Moreover, the row control circuit 116 outputs as the row enable signal RE a positive one shot pulse obtained by reversing a negative one shot pulse that is supplied to the refresh control signal REFB. Furthermore, the row control circuit 116 delays the row enable signal RE to generate a positive one shot pulse in the sense amp enable signal SE, and generates a positive one shot pulse in the precharge enable signal PE with the fall of the one shot pulse generated in the row enable signal RE as a trigger. The sense amp enable signal SE and precharge enable signal PE are generated regardless of normal write/read or refresh.

Furthermore, the row control circuit 116 delays the row enable signal RE to output the column control signal CC. The column control signal CC is not generated in the case of refresh, and therefore the column enable signal CE generated from the column control signal CC is also generated only in the case of normal write/read, and is not generated in the case of refresh. A column control circuit 117 further delays the control signal CC, and outputs the control signal CC as the column enable signal/CE. The width of the one shot pulse of the row enable signal RE determines time periods of late write, read and refresh, respectively, and therefore a pulse width necessary and sufficient for these operations is set.

The refresh control signal REFA outputted from the refresh control circuit 105 is a signal for controlling whether or not refresh is to be performed in association with an access request from outside of the semiconductor memory device, and if the signal is at the "H" level, a one shot pulse is generated in the row enable signal RE to start refresh at the fall of the address transition detection signal ATD generated according to the access request. On the other hand, if the signal is at the "L" level, no one shot pulse is generated in the row enable signal RE even if a one shot pulse is generated in the address transition detection signal ATD. In this semiconductor memory device, if the refresh operation associated with read or write continues, refresh is continuously performed in association with the memory cycles to refresh all memory cells.

At the time when all memory cells are refreshed, a state is created on a temporary basis in which refresh no longer occurs. Thereafter, when the limit of capability of holding data of memory cells (cell hold limit) is approached, this is detected, and a transition is made again to a state in which refresh is performed continuously in continuous memory cycles. As a factor of fall of the refresh control signal REFA, there is a case where refresh of one cycle is completed according to refresh associated with an access request from outside, but some time still remains until refresh of the next cycle is started, or a case where self-refresh is started, and therefore refresh associated with an access request from outside is required only after the self-refresh is completed. For generating the refresh control signal REFA, there is a method in which a latch circuit holding the refresh control signal REFA is provided in the refresh control circuit 105, and the set/reset of this latch circuit is controlled by the output signal of the refresh timer and the address transition detection signal ATD, or the like.

Specifically, timing just before the cell hold limit requiring the refresh operation is generated with the refresh timer and based on the output signal thereof, a set signal of the latch circuit is generated in the refresh control circuit 105 to set the latch circuit, and the "H" level is outputted to the refresh control signal REFA. Timing for generating the set signal is determined on the basis of the maximum value of cycle time. Then, the row control circuit 116 performs the refresh operation of memory cells by the word line unit using as a trigger the refresh control signal REFB generated based on the address transition detection signal ATD or refresh control signal REFA. When the refresh operation for all memory cells is performed, a reset signal of the latch circuit is generated in the refresh control circuit 105 to reset the latch circuit, and the "L" level is outputted to the refresh control signal REFA.

The reset of the latch circuit is performed in synchronization with a time when the refresh operation is completed in a refresh cycle in which the last word line is refreshed. Alternatively, the row control circuit 116 is caused to generate a refresh operation completion signal when the refresh operation is completed, and the latch circuit is reset when the refresh control circuit 105 receives the refresh operation completion signal in the refresh cycle for the last word line. On the other hand, the refresh control signal REFB is a signal for self-refresh. By giving a negative one shot pulse to the refresh control signal REFB, a one shot pulse can be forcefully generated in the row enable signal RE to start refresh.

For generating the refresh control signal REFB, it can be considered that a delay circuit delaying the refresh control signal REFA and a pulse generator circuit generating a negative one shot pulse are provided in the refresh control circuit 105, and timing for generating the negative one shot pulse from the pulse generator circuit is controlled by the refresh control signal REFA delayed by the delay circuit and the address transition detection signal ATD, and the like. Usually, the refresh control signal REFB is at the "H" level. If the refresh control signal REFA is caused to rise into the "H" level in this state, the rise of the refresh control signal REFA is delayed by a predetermined time period by the delay circuit, and if during the delay, no address transition detection signal ATD is generated, the pulse generator circuit is activated at the rise of the delayed refresh control signal REFA, and the refresh control signal REFB is caused to output a negative one shot pulse.

The above delay by a predetermined time period is set for making a measurement until time of a limit required for refresh of memory cells because a trigger for generating the address transition detection signal ATD is not given from outside. Furthermore, if a write request is given only after the semiconductor memory device is started up, only the write address and write data are captured, and late write onto the memory cell array 107 is not performed in a memory cycle in which the write request is made because no immediate preceding write exists. For realizing this, a flag is provided in the row control circuit 116, with the flag indicating whether the write enable signal/WE has been enabled at least one time in a state with the chip select signal/CS enabled. The row control circuit 116 initializes the flag into OFF at the time of startup of the semiconductor memory device is activated, and turns the flag ON at the time when a first write request is made.

Furthermore, when the write request is made (write enable signal/WE="L" level and chip select signal/CS="L" level), the row control circuit 116 generates a one shot pulse in the row enable signal RE only if the flag is ON. Consequently, the row control circuit 116 and the column control circuit 17 generate the control signal CC, the sense amp enable signal SE, the column enable signal/CE and the precharge enable signal PE which are required for write.

Furthermore, in FIG. 1, a boost power source 118 is a power source supplying to the row decoder 108 a up-convert potential applied to the word line in the memory cell array 107, a substrate voltage generator circuit 119 is a circuit generating a substrate voltage applied to a well on which memory cells of the memory cell array 107 are formed, or a semiconductor substrate, and a reference voltage generator circuit 120 is a circuit generating a reference voltage (e.g. ½ of power source potential) used by the memory cell array 107, the sense amp in the sense amp/precharge circuit 110, and the precharge circuit/equalize circuit. The refresh control circuit 105, the boost power source 118, the substrate voltage generator circuit 119 and the reference voltage generator circuit 120 are supplied with power down control signals PD.

The power down control signal PD is a signal for designating from outside of the semiconductor memory device a mode for setting the semiconductor memory device at a power down state (standby state). The refresh control circuit 105, the boost power source 118, the substrate voltage generator circuit 119 and the reference voltage generator circuit 120 are configured to control power supply to them, respectively, according to the power down control signal PD. For the semiconductor memory device shown in the figure, the memory cell itself is similar to that of the DRAM, and therefore power supply to circuit portions in the semiconductor memory device cannot be simply stopped in the standby state unlike the SRAM. Even in the standby state, power should be continuously supplied to circuits required for the refresh operation for holding data of the memory cell.

Thus, the semiconductor memory device is provided with several modes in the standby state to ensure compatibility with the SRAM as much as possible, and also provided with modes that would not exist in existing semiconductor memories. Specifically, three types of standby modes are provided, and standby mode 1 is a power supply mode equivalent to that of the usual DRAM, and takes the highest current consumption in the three types of standby modes. In this case, however, power is still supplied to all circuits required for refresh of the memory cell. Thus, data of the memory cell immediately before transition to the standby state is held, and also time taken until transition of the semiconductor memory device from the standby state to the active state is the shortest in the three types of standby modes.

Standby mode 2 is a mode for stopping power supply to the refresh control circuit 105, wherein no power is supplied to circuits required for refresh, and therefore data of the memory cell cannot be held in the standby state, but current consumption can be reduced accordingly compared with standby mode 1. This mode results from a shift from the established concept that data is held in the standby state, and if a transition is made from the standby state to the active state, write can be performed over the entire memory cell array.

Standby mode 3 is a mode for stopping power supply to the refresh control circuit 105, the boost power source 118, the substrate voltage generator circuit 119 and the reference voltage generator circuit 120, wherein as the boost voltage, substrate voltage, and reference voltage are required to atartup, time until transition from the standby state to the active state is the longest in the three types of standby modes, but current consumption in the standby mode can be the lowest. Standby mode 2 and standby mode 3 are modes suitable for use of the semiconductor memory device as a buffer. Furthermore, in any case of standby modes 1 to 3, power is supplied to required circuits for circuits other than the four types of circuits described above.

Operations of the above prior art will now be described with reference to FIGS. 1 and 2. As described above, it is exceptional in that for first write after startup of the semiconductor memory device, the operation is different from operations of second and subsequent write. FIG. 2 shows second and subsequent write operations assuming that at least first write has been performed. That is, assume that a request of write of data "Qx" to an address "Ax" was made in the previous memory cycle. Consequently, in the memory cycle, the address "Ax" is captured in the address register of the register circuit 103, and data "Qx" is captured in the data register of the register circuit 112.

FIG. 2 shows operation timing where write to the address "An" and read from the address "An+1" are performed consecutively. Furthermore, the value of the refresh address R-ADD is "R1−1" before write. Furthermore, the address "An−1" is an address given in the immediately preceding memory cycle. If the write request was made in the immediately preceding memory cycle, the address "An" equals the address "Ax" and otherwise, there was at least one read request between the immediately preceding write request and the request of write to the address "An".

First, in the case of the memory cycle for write, at the time t1, the address Add starts to change from the value "An−1" kept hitherto to "An". At this time, the latch control signal LC is at the "L" level, and the control signal LW1 is at the "L" level. Accordingly, the address Add is buffered by the address buffer 101, and passes through the latch 102 to change into an internal address LC-ADD, and the internal address LC-ADD passes through the register circuit 103 to change into an internal address L-ADD. The ATD circuit 104 detects that the address Add starts to change from the change of the internal address LC-ADD. Furthermore, the address skew period (equivalent to TSKEW) at this time, and therefore the value of the address Add is not necessarily determined at this time same as in the case of the general-purpose SRAM.

Therefore, the address Add cannot be captured in the latch 102 at time t1 and thereafter, the address Add is held in the latch 102 at the time when the value of the address Add is determined as "An" after elapse of time TSKEW. Furthermore, a negative pulse is inputted to the write enable signal/WE at, for example, time t2 within the address skew period. The R/W control circuit 114 turns the control signal CWO into the "L" level in response to the fall of the write enable signal/WE, and also turns both control signals LW1 and LW2 into the "H" level. As a result, the I/O buffer 113 sends write data on the bus I/O onto the bus WRBX. The vale of write data is not necessarily determined at this time. The register circuit 103 outputs as the internal address L-ADD the address "Ax" held in the address register, and the register circuit 112 outputs onto the bus WRB the data "Qx" held in the data register.

At time t3, the value of the address Add is determined as "An". Furthermore, at time t3, time TSKEW elapses after the time at which the address Add (=internal address LC-ADD) starts to change, and therefore the ATD circuit 104 generates a positive one shot pulse in the address transition detection signal ATD at subsequent time t4. In response to rise of the address transition detection signal ATD, the refresh circuit 105 increments the value of the refresh address R-ADD by "1" to update the value to "R1" for the refresh operation that is performed subsequently to write. The late write operation is started at the rise of the address transition detection signal ATD. That is, the multiplexer 106 selects the internal address L-ADD side in response to the rise of the address transition detection signal ATD.

At this time, the register circuit 103 outputs as the internal address L-ADD the address "Ax" held by the address register, and the multiplexer 106 outputs this value to the row decoder 108 as the address M-ADD. Furthermore, in the same way, the row control circuit 116 generates a positive one shot pulse in the row enable signal RE in response to the rise of the address transition detection signal ATD. Consequently, the row decoder 108 activates a word line corresponding to the address "Ax". Then, in response to the one shot pulse of the row enable signal RE, the row control circuit 116 generates a positive one shot pulse in the sense amp enable signal SE, and also generates a positive one shot pulse in the control signal CC and outputs the same to the column control circuit 117. Consequently, the column control circuit 117 generates a positive one shot pulse in the column enable signal/CE.

When the column enable signal CE is turned into the "H" level in this way, the column decoder 109 decodes a row address included in the internal address L-ADD (=address "Ax"), and generates a positive one shot pulse in a column selection signal corresponding to the row address. As a result, of sense amps in the sense amp/precharge circuit 110, a sense amp corresponding to the above row address is selected and connected to the bus WRB. As a result thereof, write of data "Qx" in a memory cell corresponding to the address "Ax" through the sense amp in the sense amp/precharge circuit 110 is started at time t4. Thereafter, at time 5, data "Qn" being write data to the address "An" is supplied, and the data is carried on the bus I/O and sent onto the bus WRBX through the I/O buffer 113.

At this time, the bus WRBX is not connected to the bus WRB, the data "Qn" is not involved in write in the memory cell array 107. Thereafter, the row control circuit 116 causes the one shot pulse of the row enable signal RE to fall for completing the write operation of the row control circuit 116. Thereupon, the row decoder 108 deactivates a write word line corresponding to the address "Ax". Then, the row control circuit 116 causes the sense amp enable signal SE to rise to complete the write operation through the sense amp in the sense amp/precharge circuit 110. Then, the row control circuit 116 causes the control signal CC to fall, and the column control circuit 117 responding to the fall causes the column enable signal CE to fall. As a result, the column decoder 109 disables the column selection signal to separate the sense amp in the selected sense amp/precharge circuit 110 from the bus WRB.

Then, the row control circuit 116 causes the precharge enable signal PE to rise, whereby the precharge circuit in the sense amp/precharge circuit 110 pre-charges bit lines in preparation for the next access. Then, after elapse of a time period required for the precharge operation, the row control circuit 116 causes the precharge enable signal PE to fall to complete the operation of precharge of bit lines by the precharge circuit in the sense amp/precharge circuit 110. Then, when the address transition detection signal ATD falls at time t6, the refresh operation is started. That is, the address transition detection signal ATD is turned into the "L" level, whereby the multiplexer 106 selects the refresh address R-ADD, and outputs "R1" as the address M-ADD.

Furthermore, in response to the fall of the address transition detection signal ATD, the row control circuit 116 generates a positive one shot pulse in the row enable signal RE. Consequently, the row decoder 108 activates a word line corresponding to the value of the address M-ADD "R1". As a result, in the memory cell array 107, held data of the memory cell connected to the refresh word line appears as a potential on the bit line. Thereafter, when the row control circuit 116 generates a positive one shot pulse in the sense amp enable signal SE, the sense amp in the sense amp/precharge circuit 110 is activated, and refresh of each memory cell connected to the refresh word line is started. Furthermore, the refresh operation itself is similar to the operation performed in the DRAM.

If the write enable signal/WE is caused to rise at, for example, time t7 in the middle of performing refresh in this way, the R/W control signal 114 causes both control signals LW1 and LW2 to fall. In response to the fall of the control signal LW1, the register circuit 103 captures the value of the internal address LC-ADD "An" in the address register at time t8. Furthermore, in response to the fall of the control signal LW2, the register circuit 112 captures data "Qn" on the bus WRBX into the data register at time t8. The addresses "An" and "Qn" captured in the registers will be used for the late write operation in the memory cycle at the time when the next write request is made. Thereafter, at time t9, the memory cycle for write is completed to make a transition to the memory cycle for read.

At this time, the refresh operation associated with late write is consecutively performed. When a time period required for refresh elapses after start of refresh (time t6), the row control circuit 116 causes the row enable signal RE to fall for completing the refresh operation. Consequently, the row decoder 108 deactivates the fresh word line. Then, the row control circuit 116 causes the sense amp enable signal SE to fall to deactivate sense amps in the sense amp/precharge circuit 110 which have finished refresh. At this time, the latch control circuit 115 causes the latch control signal LC to fall in response to the fall of the sense amp enable signal SE. In the process of refresh, it is not necessary to output data of the memory cell to outside of the semiconductor memory device, and therefore no one shot pulse is generated in the column enable signal CE even if a one shot pulse is generated in the row enable signal RE. Thus, the column decoder 109 keeps the column selection signal in an inactive state.

When the refresh operation is completed as described above, the row control circuit 116 generates a one shot pulse in the precharge enable signal PE to pre-charge the bit line in the same manner as when write is completed. The operation described hitherto is performed by time t10 (when time TSKEW elapses after time of start of the read cycle subsequent to the write cycle) at the latest. In this example, by preventing generation of the one shot pulse of the address transition detection signal ATD as long as the address Add is undetermined, control is performed so that the write or read operation is not started until the address skew period expires, and therefore no problem arises even if the refresh operation is postponed to the time of completion of the address skew period of the next memory cycle. Furthermore, in accordance with this control, the internal address L-ADD used in the write/read address holds the value of the immediately preceding memory cycle during the address skew period.

In FIG. 2, the time t1 to t9 (time t3 to t10 for actual operations) corresponds to one memory cycle, and the cycle time is denoted by "Tcyc". Furthermore, the time t7 to t9 corresponds to the recovery time TWR described above. In the operation shown in FIG. 2, however, it is not necessary to reserve the recovery time TWR because the precharge operation after late write is completed before the refresh operation. For example, the write enable signal/WE may rise at time t9 and in this case, the recovery time TWR is zero.

Then, in the case of the memory cycle for read, the value of the address Add starts to change from "An" at time t9. In this case, since the address skew period continues until time t10, the address Add is not captured in the latch 102 until the address is determined as "An+1". Furthermore, if a read request is made, the write enable signal/WE is never caused to fall during the address skew period and instead, the output enable signal/OE is enabled. Thus, the R/W control circuit 114 turns the control signal CWO into the "H" level in preparation for read from the memory cell, and also keeps both the control signals LW1 and LW2 at the "L" level. Consequently, the I/O buffer 113 sends data on the bus WRBX to the bus I/O.

At this time, address skew period still continues, the hit control signal HE is still in the immediately preceding memory cycle, and thus whether data on data WRB is read onto the bus WRBX, or data held in the data register is read is not determined. When the address skew time expires and time t10 is reached, the values of the address Add and the internal address LC-ADD are determined at "An+1". At this time, the control signal LW1 is at the "L" level, and therefore the value of the internal address LC-ADD is outputted directly as the internal address L-ADD. Furthermore, since the value of the internal address LC-ADD "An+1" is not equal to the address "An" held in the address register, the register circuit 103 outputs the "L" level as the hit signal HITS. At time t11, the ATD circuit 104 generates a positive one shot pulse in the address transition detection signal ATD, whereby the read operation is started.

The refresh control circuit 105 updates the value of the refresh address R-ADD from "R1" to "R1+1". Furthermore, the hit control circuit 111 captures the hit signal HITS at time t11, and outputs the "L" level as the hit enable signal HE. Consequently, the register circuit 112 connects the bus WRB and the bus WRBX, and the sense result by the sense amp in the sense amp/precharge circuit 110 can be outputted to outside of the semiconductor memory device through the I/O buffer 113 and the bus I/O. The multiplexer 106 selects the internal address L-ADD and outputs the address "An+1" to the row decoder 108 as the address M-ADD. At the same time, the row control circuit 116 generates a positive one shot pulse in the row enable signal RE, and the row decoder 108 activates a word line corresponding to the address "An+1".

As a result, held data of the memory cell connected to the read word line is read as a potential on the bit line. Then, the row control circuit 116 generates positive one shot pulses in the sense amp enable signal SE and the control signal CC, respectively. Then, the column control circuit 117 generates a positive one shot pulse in the column enable signal/CE, and the column decoder 109 activates a column selection signal corresponding to the row address in the address "An+1", and connects a sense amp corresponding to the column selection signal to the bus WRB. This sense amp senses data of each memory cell connected to the read word line to amplify the same to the level of "0"/"1". As a result, at time t13, data "Qn+1" stored in the address "An+1" appears on the bus WRB, and is read from the bus I/O to outside through the register circuit 112, the bus WRBX and the I/O buffer 113.

Thereafter, for completing the read operation, the row control circuit 116 causes the row enable signal RE to rise. Then, in the same manner as in write, a read word line corresponding to the address "An+1" is deactivated, and the sense amp enable signal SE goes into the "L" level so that the sense amp in the sense amp/precharge circuit 110 completes the sense operation. Furthermore, the column control circuit 117 turns the column enable signal CE into the "L" level to separate the sense amp from the bus WRB. Then, the row control circuit 116 generates a one shot pulse in the precharge enable signal PE to pre-charge the bit line. At time t12, the address transition detection signal ATD falls, and the refresh operation associated with read is started.

In this case, the operation performed at time t12 to t15 is same as refresh associated with write except that "R1+1" is used as the refresh address R-ADD instead of "R1". When time t14 is reached during the refresh operation, the memory cycle for read ends and a new memory cycle subsequent thereto is started, and the refresh operation is completed in the new memory cycle until the address skew period expires. Furthermore, the time t9 to t14 (time t10 to t15 for actual operations) also corresponds to one memory cycle, and the cycle time is denoted by "Tcyc". In FIG. 2, if the read address is not "An+1" but "An", write data "Qn" to the address "An" is not reflected yet in the memory cell array 107. Accordingly, a bypass operation described below is performed.

In this case, at time t10 shown FIG. 2, the value of the address Add is determined as "An", and this value "An" is outputted to the internal address LC-ADD as well. At this time, the address register in the register circuit 103 holds "An", and therefore the register circuit 103 outputs the "H" level as the hit signal HITS. Thereafter, at time t11 when the address transition detection signal ATD rises, the hit control circuit 111 captures the hit signal HITS, and outputs the "H" level as the hit enable signal HE. Because of the read operation in this case, the R/W control circuit 114 outputs the "L" level as the control signal LW2. Thus, the register circuit 112 outputs data "Qn" held in the data register onto the bus WRBX.

Thereafter, as in the case where the read address is "An+1", data stored in the address "An" is read from the memory cell array 107 and at time t13, the data is read onto the bus WRB. However, since this data is old data before write, it is not used as read data but discarded. Instead, data "Qn" outputted on the bus WRBX is outputted to outside of the semiconductor memory device through the I/O buffer 113 and the bus I/O. Furthermore, if the bypass operation is performed, read from the memory cell array 107 is not required, and it is therefore possible to reduce current consumption without starting the read operation.

In this case, the hit enable signal HE is also supplied to the row control circuit 116. If a read request is made, and the hit enable signal HE is at the "H" level in timing of rise of the address transition detection signal ATD, the row control circuit 116 and the column control circuit 117 perform control so as not to generate the row enable signal RE and signals chronologically generated from the signal (sense amp enable signal SE, control signal CC, column enable signal/CE, column selection signal, precharge enable signal PE). As described above, in this semiconductor memory device, the write enable signal/WE associated with the write request is caused to rise within the address skew period, and therefore whether the access is write or read is determined at the time when the address is determined.

Moreover, because late write is performed, both the write address and write data are already determined before the address skew period, thus making it possible to start the write operation or read operation immediately at the time when whether the access request is write or read is determined. Furthermore, it is not necessary to reserve recovery time TWR. Thus, time required for write or read is the shortest, thus making it possible to reduce the duration of one memory cycle (time t3 to t10 or time t10 to t15) to a minimum. Furthermore, since refresh is performed after write or read is performed, the speed of access can be enhanced by an amount equivalent to time required for performing refresh compared with the case where read or write is performed after refresh.

In this way, in the method of performing write in the memory cell by late write, if a write request is made, it is not necessary to wait until write data for the write request is determined, and the operation of write in the memory cell corresponding to the previous write request and the refresh operation subsequent thereto, and capturing of next write data can be performed at the same time. Thus, write time does not depend on when write data is determined, write time and read time can be equally fixed, and the refresh operation can be well performed within a predetermined memory cycle after write or read is performed.

In the prior art described above, owing to write by late write, the duration of the memory cycle for write can be reduced to a minimum, which is equivalent to the duration of the memory cycle for read, and therefore the refresh operation can be performed in each write cycle even in a state in which the write cycle is continued, but the refresh operation associated with each memory cycle is started with a trigger signal generated after elapse of a predetermined time period after the ATD circuit 104 detects an address transition outputted from the address latch circuit 102, and therefore a situation may arise in which the refresh operation is not started if no memory access is made for a long time.

For avoiding such a situation, a refresh timer is included in the refresh control circuit 105 in the prior art described above. The refresh timer clocks time passing after an access request is most recently made from outside of the semiconductor memory device and if it exceeds predetermined refresh time, self-refresh is started in the semiconductor memory device. Thus, the refresh timer is configured to be reset and restart clocking each time when the address transition detection signal ATD is enabled.

That is, in the above prior art, refresh is performed in association with each memory cycle and therefore if memory accesses are successively made, the memory refresh operation may be performed more than necessary, resulting in wasted power consumption. Furthermore, as a memory refresh unit, two units, i.e. a refresh unit associated with each memory cycle and a refresh apparatus constituted by a refresh timer are provided, and the configuration for refresh is duplicated, thus causing an increase in cost.

DISCLOSURE OF THE INVENTION

In view of the above problems, an object of the present invention is to provide a semiconductor memory device capable of performing a refresh operation for the above memory cells only according to a periodic refresh request outputted from a refresh timer, effectively avoiding a collision between a memory access request and a memory refresh request, and reliably performing a refresh operation for the memory refresh request in a memory cycle, and a refresh control method thereof.

The present invention provides a semiconductor memory device having a memory cell array constituted by memory cells requiring refresh, in which a read request or write request is asynchronously given to an access address, wherein the semiconductor memory device comprises:

a refresh timer periodically outputting a refresh request signal for the above described memory array;

a late write writing circuit writing, for the above described write request, a access address and write data for a write request given in a memory cycle at a time point before a memory cycle for the write request by late write; and a refresh control circuit performing refresh for the above described memory array in response to a refresh request signal from the above described refresh timer, and delaying performance of the above described refresh until a read operation or late write writing operation of memory cells for the colliding read request or write request is completed when the above described refresh request signal collides with the above described read request or the above described write request.

That is, in the present invention, the refresh operation for the memory cell array is periodically performed independently of the memory cell access operation, thus making it possible to prevent power consumption by an unnecessary refresh operation. Furthermore, if the refresh operation collides with the memory access operation, the refresh operation is delayed until the colliding memory access operation is completed, and therefore it is not necessary to consider the refresh operation in memory access. Further, if the memory access is a write request, a write operation by late write is performed and therefore irrespective of whether the colliding memory access is a read request or write request, delay of the refresh request associated therewith can be within a predetermined time period, thus making it possible to well performing the refresh operation for the colliding refresh request in the memory cycle.

Furthermore, the refresh timer in the present invention has a capability of switching so that a timer cycle in an active state is shorter, and a timer cycle in a standby state, in which the refresh operation is performed, is longer as a timer cycle in which a refresh request trigger of the refresh timer is generated. In the active state, potential variations (disturb) of a bit line occur every time the bit line is accessed, and thus the held potential of the memory cell tends to be instable to reduce memory holding time. Thus, by reducing the refresh period in the active state compared with the refresh cycle in the standby state, storage of the memory cell is stabilized.

MODE FOR CARRYING OUT THE INVENTION

Figure 3:
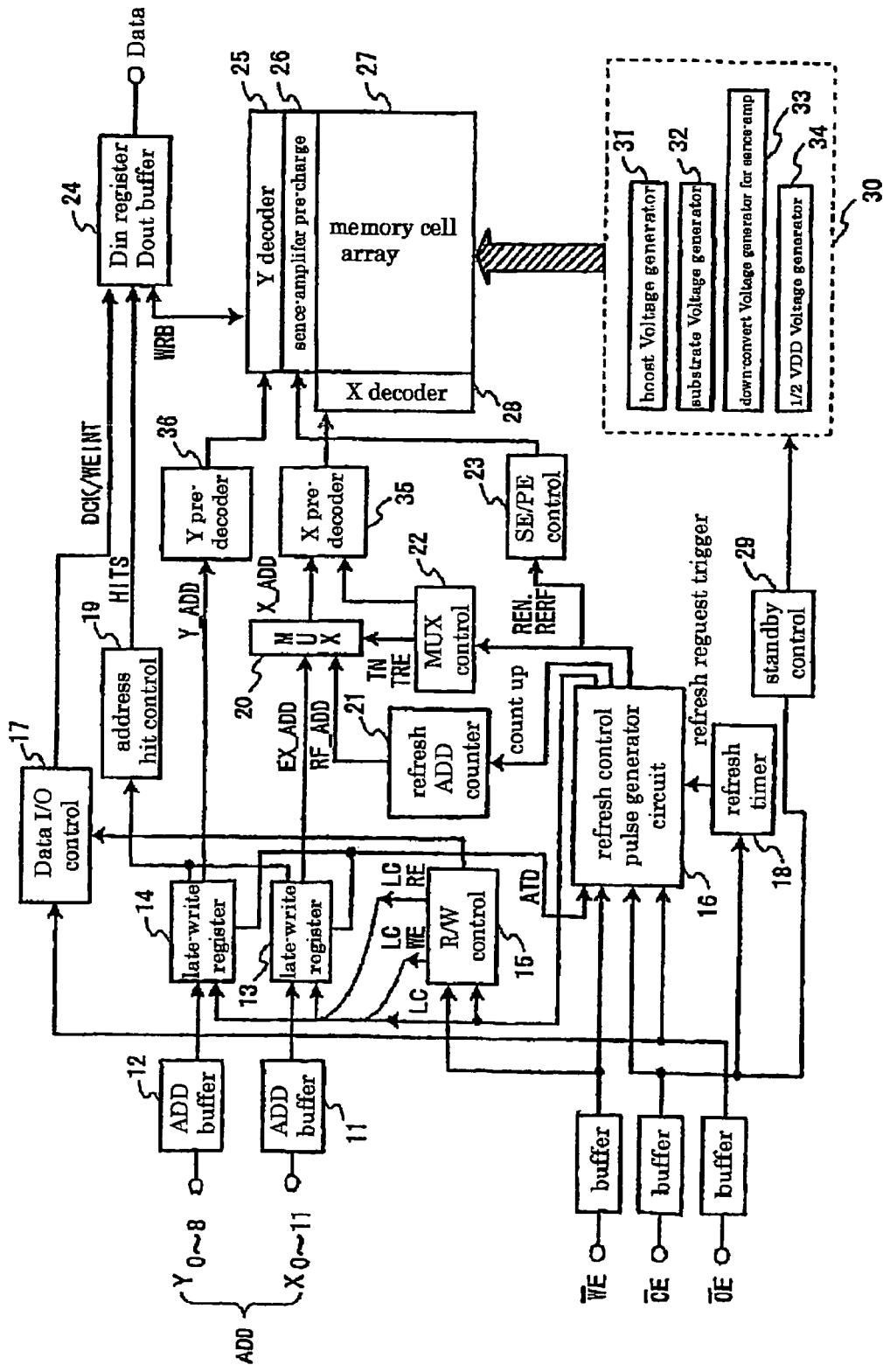
FIG. 3 is a block diagram showing a configuration of a semiconductor memory device according to the first embodiment of the present invention.

FIG. 3 is a diagram showing a configuration of a semiconductor memory device according to the first embodiment of the present invention.

Figure 1:
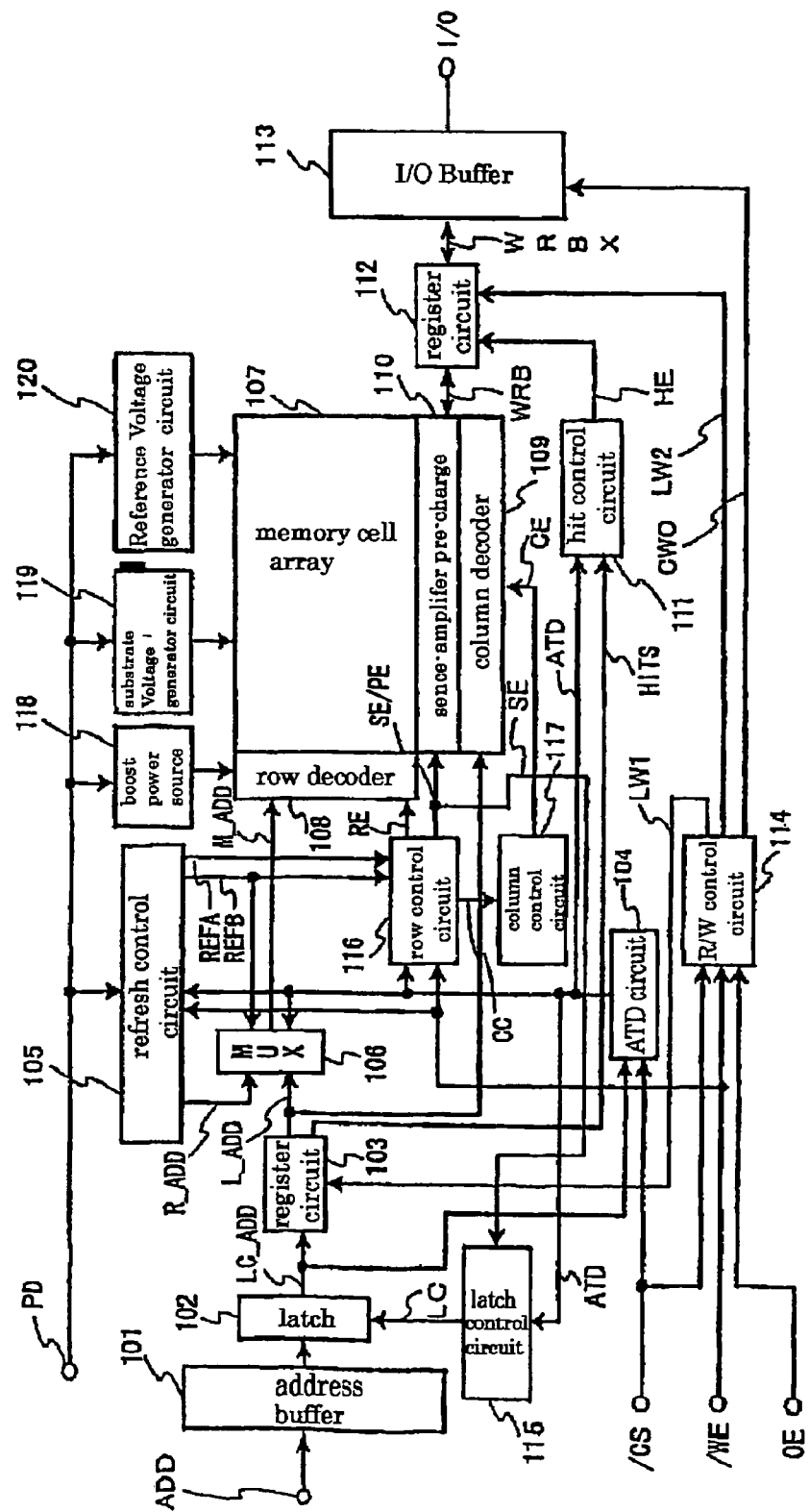
FIG. 1 is a block diagram showing a configuration of a conventional semiconductor memory device.
Figure 2:
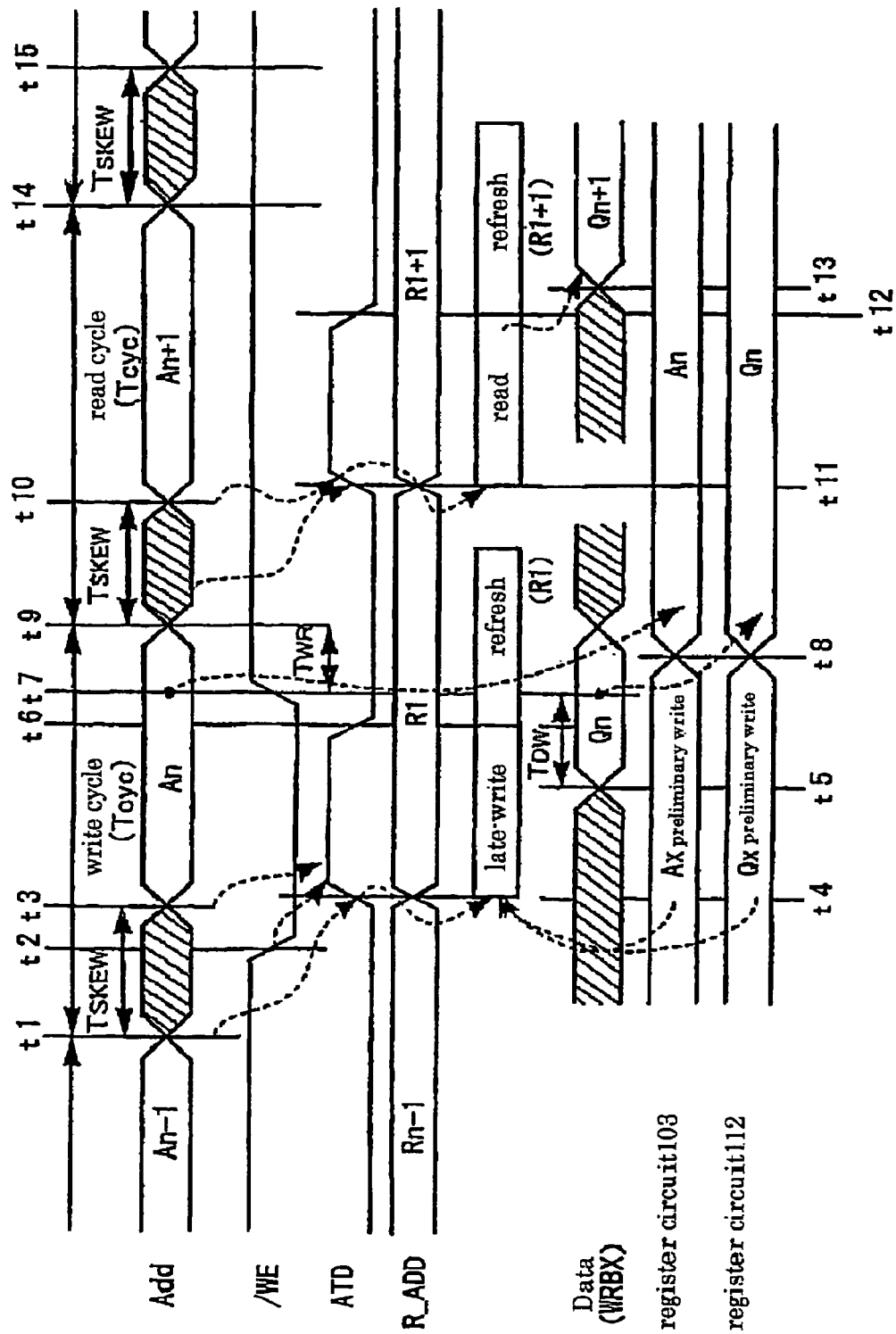
FIG. 2 is a timing chart for explaining operations of the conventional semiconductor memory device.

In this figure, an address ADD is an access address supplied from outside of the semiconductor memory device. In accordance with an arrangement of a memory cell array 27 in a matrix form, the address ADD includes a row address (hereinafter referred to as X address) and a column address (hereinafter referred to as Y address). Address buffers 11 and 12 buffer the X address and Y address and output the same. Late write registers 13 and 14 has a register for late write and a latch circuit 102 in FIG. 1. The late write registers 13 and 14 include therein registers (address register) for holding access addresses equal in bit width to the X address and the Y address, respectively.

An address outputted from the late write register 14 for Y address is inputted to a Y predecoder 36 as an address Y-ADD for memory access, decoded into a plurality of blocks, and then inputted to a Y decoder 25. An internal address EX-ADD outputted from the late write register 13 for X address is outputted to a multiplexer (hereinafter referred to as MUX) 20. The MUX 20 switches between the internal address EX-ADD outputted from the late write register 13 for X address and an address RF-ADD for refresh outputted from a refresh address counter 21. The X address X-ADD switched by the MUX 20 is inputted to an X predecoder 35, decoded into a plurality of blocks, and then inputted to an X decoder 28.

Furthermore, the X address X-ADD and the Y address can be inputted directly to the X decoder 28 and the Y decoder 25 to omit the Y-ADD X predecoder 35 and the Y predecoder 36. Furthermore, in this embodiment, a late write operation similar to that of the prior art described above is performed in the sense that write in the memory cell is performed by late write, and that data stored in the data register is read at the time of address hit during performance of read. The late write operation in this embodiment is performed mainly by late write registers 13 and 14, an R/W control circuit 15, a data I/O control circuit 17, an address hit control circuit 19 and a Din register/Dout buffer 24.

The R/W control circuit 15 inputs a write enable signal/WE, and a latch control signal LC from a refresh control pulse generator circuit 16, outputs signals LCWE and LCRE for control of the late write operation to late write registers 13 and 14, and outputs a signal providing instructions to write or read data to the data I/O control circuit 17. The data I/O control circuit 17 inputs an output enable signal/OE, and the signal providing instructions to write or read data, and outputs an internal clock DCK for capturing data and an internal clock WEINT for write of data.

The refresh control pulse generator circuit 16 inputs a refresh request trigger from a refresh timer 18, a chip enable signal/CE, the output enable signal/OE, the write enable signal/WE, and an address transition detection signal ATD outputted from late write registers 13 and 14, generates a latch control signal LC, a row enable normal signal REN, a row enable refresh signal RERF and a refresh address count-up signal, and outputs these signals to the R/W control circuit 15 and late write registers 13 and 14, a MUX control circuit 22, a sense enable/precharge enable control circuit (hereinafter referred to as SE/PE control circuit) 23, and the refresh address counter 21, respectively.

The refresh address counter 21 counts up the refresh address RF-ADD by the refresh address count-up signal inputted from the refresh control pulse generator circuit 16, and outputs the same to the MUX 20. The MUX control circuit 22 outputs a normal address transfer control signal TN and a refresh address transfer control signal TRE each having a predetermined pulse width to the MUX 20 for performing control to switch between the internal address EX-ADD and the refresh address RF-ADD as an address outputted from the MUX 20 by the row enable normal signal REN and the row enable refresh signal RERF outputted from the refresh control pulse generator circuit 16 in response to an external address transition and timer trigger.

The normal address transfer control signal TN and the refresh address transfer controls signal TRE are also inputted to the X predecoder 35. The SE/PE control circuit 23 controls a sense amp/precharge circuit 26 in a DRAM by the row enable normal signal REN and row enable refresh signal RERF inputted from the refresh control pulse generator circuit 16.

A standby control circuit 29 is a circuit for controlling operation voltages of internal voltage generator circuits 30 such as a boost voltage generator circuit 31, a substrate voltage generator circuit 32, a down-convert voltage generator circuit for sense amp 33 and a ½ VDD voltage generator circuit 34 according to the standby mode described in the prior art, but they are not described in detail because their configurations are not related directly to the present invention.

Figure 4:
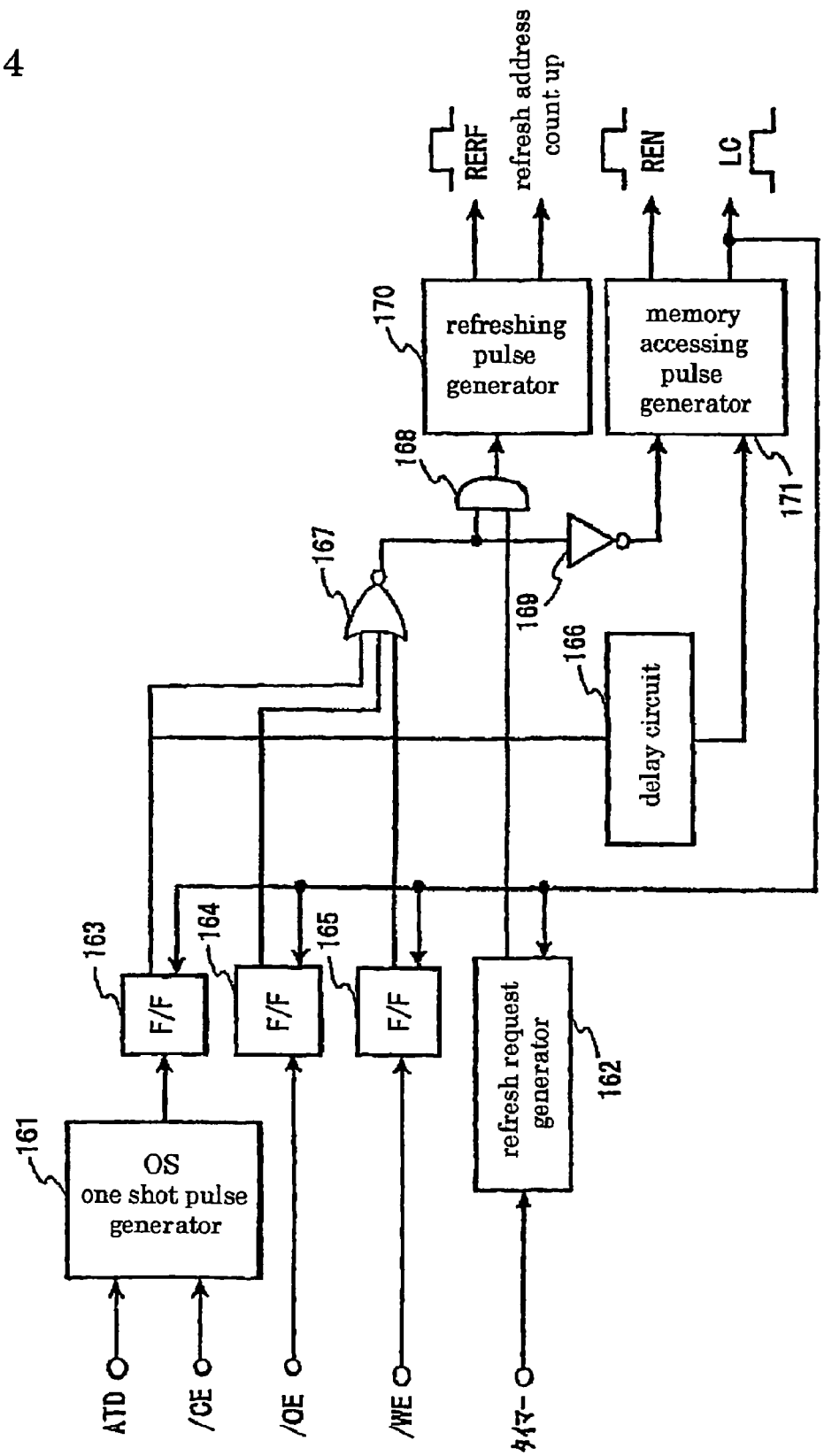
FIG. 4 is a block diagram showing an example of a configuration of a refresh control pulse generator circuit in this embodiment.

FIG. 4 is a block diagram showing an example of a configuration of the refresh control pulse generator circuit 16. In FIG. 4, a one shot pulse generator circuit 161 outputs a one shot pulse OS when the address transition detection signal ATD is inputted from late write registers 13 and 14 in a state in which the chip enable signal/CE is inputted, and a latch circuit 163 turns its output into a "H" level with rise of the one shot pulse OS. Furthermore, when a read enable signal/OE and the write enable signal/WE are inputted ("L" level), latch circuits 164 and 165 output the "H" level at fall of the signals.

Outputs of latch circuits 163, 164 and 165 are inputted to a NOR gate 167. Thus, the output of the NOR gate 167 is at the "H" level only when the outputs of latch circuits 163, 164 and 165 are all at the "L" level, and is at the "L" level when any of latch circuits 163, 164 and 165 is at the "H" level. The "L" level output of the NOR gate 167 is inputted to an AND gate 168 as a refresh prohibition signal, and inputted through an inverter 169 to a memory accessing pulse generator circuit 171 as a memory access request signal.

The output of a delay circuit 166 delaying by a predetermined time period a "H" level signal outputted from the latch circuit 163 is also inputted to the memory accessing pulse generator circuit 171, and the memory accessing pulse generator circuit 171 causes the latch control signal LC to rise to the "H" level at the time when the output of the inverter 169 rises to the "H" level, and causes the row enable normal signal REN to rise to the "H" level at the time when the output of the delay circuit 166 rises to the "H" level after a predetermined time period, whereby memory access is started. Delay time of the delay circuit 166 is provided for starting read/write after a delay equivalent to refresh operation time in anticipation because read/write cannot be started immediately if the refresh operation for the memory cell is being performed at the time when the memory access signal is inputted from the inverter 169.

When receiving a refresh request trigger from the refresh timer 18, the refresh request generator circuit 162 is turned into the "H" level, and outputs the output through the AND gate 168 to a refreshing pulse generator circuit 170 as a refresh request signal. Thus, unless the memory access operation is being performed, the output of the NOR gate 167 is at the "H" level, and therefore when the refresh request trigger is inputted from the refresh timer 18, the refresh request signal is inputted to the refreshing pulse generator circuit 170, and the row enable refresh signal RERF and the refresh address count-up signal are outputted from the refreshing pulse generator circuit 170 to immediately perform the refresh operation.

On the other hand, during performance of a memory access operation, the output of the NOR gate 167 is at the "L" level, and therefore the refresh request signal is blocked at the AND gate 168 to inhibit the refresh operation. Thereafter, however, at the elapse of memory access operation time, the latch control signal LC outputted from the memory accessing pulse generator circuit 171 falls from the "H" level to the "L" level. The latch control signal LC falling to the "L" level is inputted to latch circuits 163, 164 and 165 and the refresh request generator circuit 162 as a reset signal. By this reset signal, latch circuits 163, 164 and 165 are reset and their outputs are turned into the "L" level.

As a result, the output of the NOR gate 167 is turned into the "H" level to cancel refresh prohibition, the AND gate 168 is opened so that a refresh request signal from the refresh request generator circuit 162 is inputted to the refreshing pulse generator circuit 170 and at this time, the refresh operation is started. Thus, if the refresh request signal collides with the memory access operation, the colliding refresh request is delayed until the latch control signal LC defining a memory access operation period falls from the "H" level to the "L" level, and then the refresh operation is started.

The delay time is no more than time elapsing until the latch control signal LC defining the memory access operation falls from the "H" level to the "L" level, and much shorter than the memory refresh cycle, and the delay time has no influence on memory refresh. Furthermore, the refresh request generator circuit 162 prepares for a next refresh request trigger from the refresh timer 18 by switching the refresh request signal from the "H" level to the "L" level slightly after the latch control signal LC falls to the "L" level.

Figure 5:
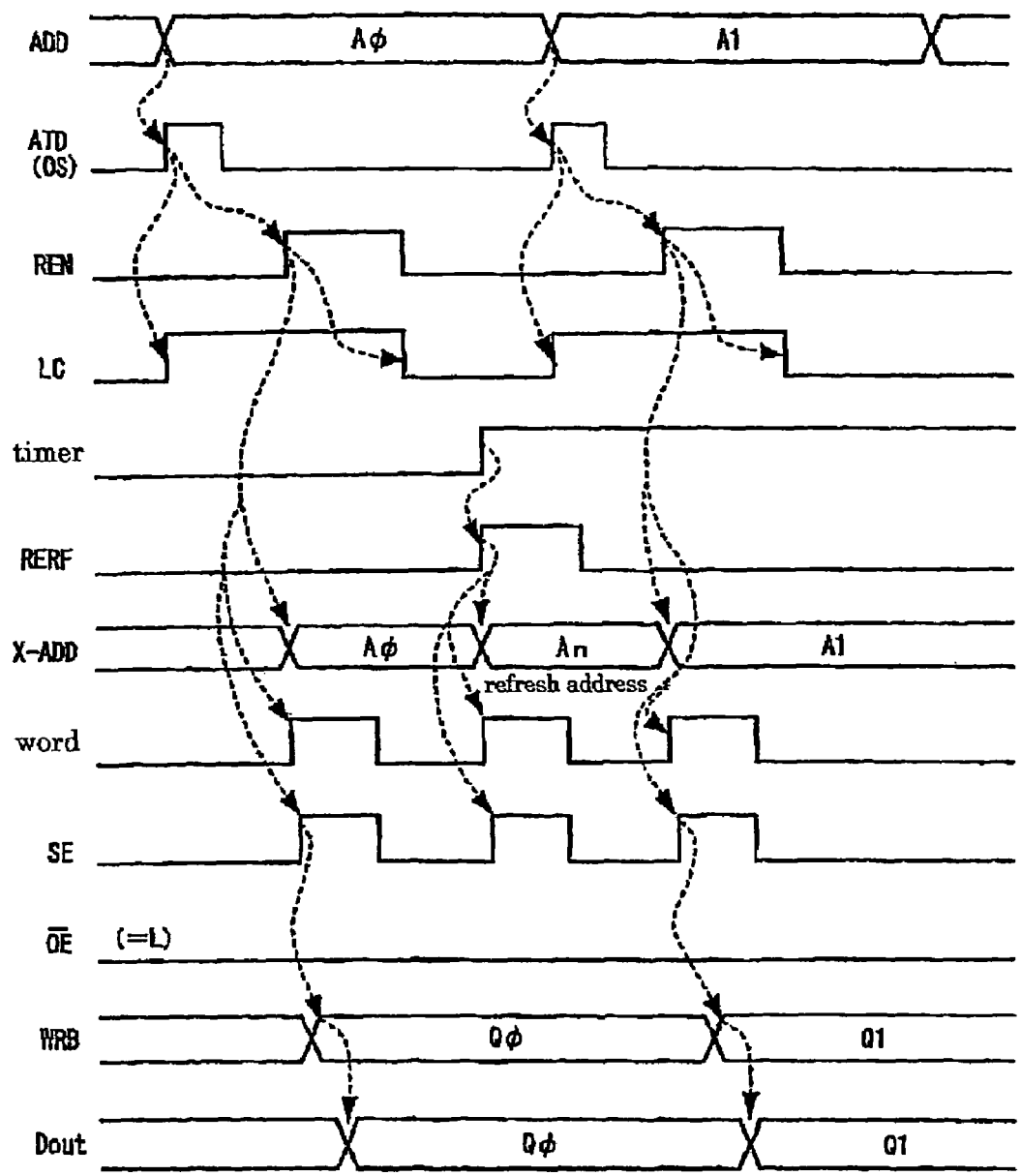
FIG. 5 is a timing chart showing a relation between a memory read operation and a refresh operation in the semiconductor memory device of this embodiment.
Figure 6:
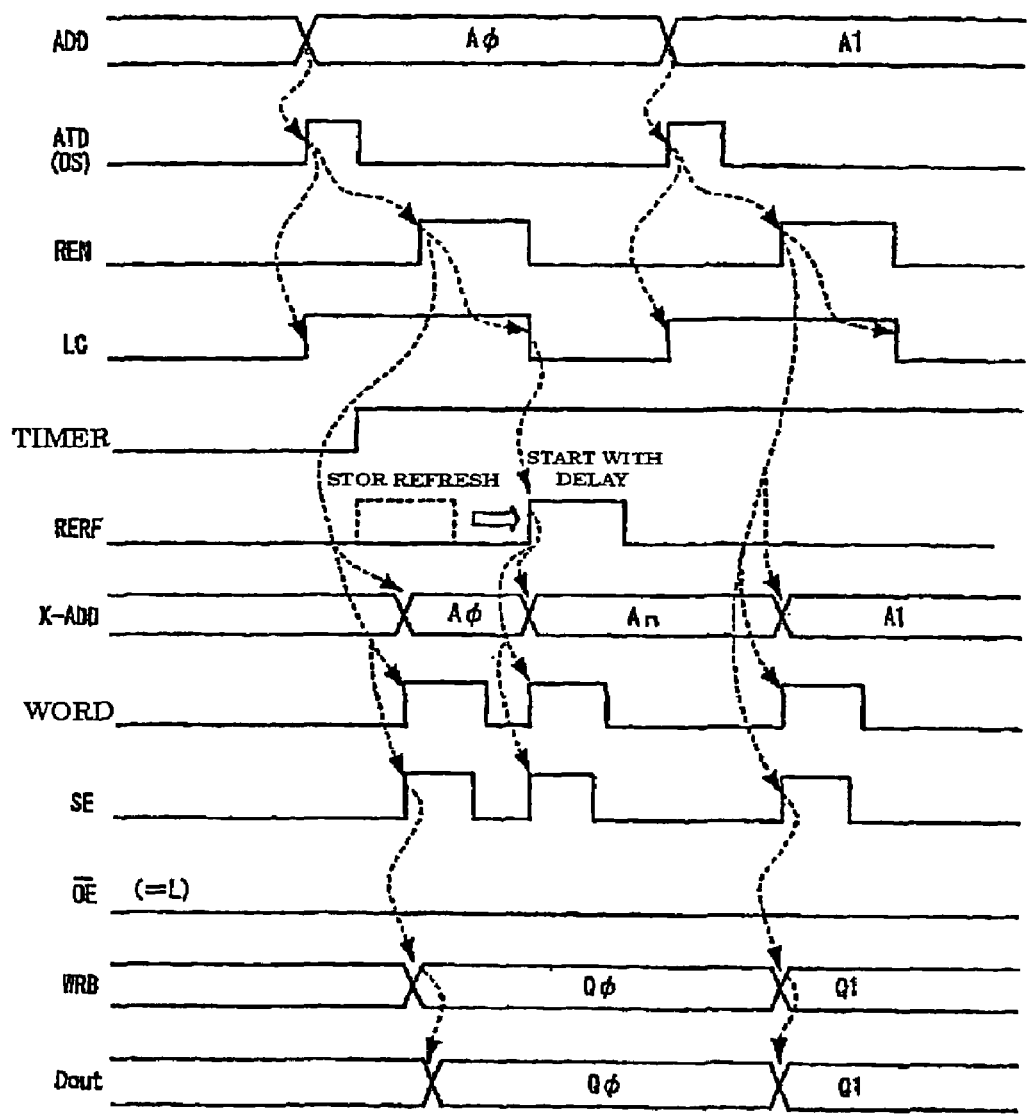
FIG. 6 is a timing chart showing a relation between the memory read operation and the refresh operation in the semiconductor memory device of this embodiment.

FIGS. 5 and 6 are timing charts each showing a relation between a memory read operation and a refresh operation in the semiconductor memory device of the present invention, and FIG. 5 shows the case where the refresh request does not collide with the read operation, while FIG. 6 shows the case where the refresh request collides with the read operation. Operations of the present invention will be described below with reference to FIGS. 3 to 6. Furthermore, a bit line is selected at the time of memory read, but the bit line selection operation at the time of memory read is omitted in FIGS. 5 and 6.

When a request for reading data of a memory cell of an address A? is made, X address of the address A? is inputted to the late write register 13 and Y address of the address A? is inputted to the late write register 14. A change in address signals inputted to late write registers 13 and 14 is inputted to the one shot pulse generator circuit 161 of the refresh control pulse generator circuit 16 as the ATD signal, and a one shot pulse OS is outputted from the one shot pulse generator circuit 161. By this one shot pulse OS, the latch circuit 163 is turned into the "H" level, and the latch control signal LC outputted from the memory accessing pulse generator circuit 171 rises to the "H" level, whereby the address A? is latched in late write registers 13 and 14.

Furthermore, when a signal obtained by delaying the one shot pulse OS outputted from the one shot pulse generator circuit 161 at the delay circuit 166 by a predetermined time period is inputted to the memory accessing pulse generator circuit 171, the row enable normal signal REN is outputted from the memory accessing pulse generator circuit 171 to the MUX control circuit 22 and the SE/PE control circuit 23. When the row enable normal signal REN is inputted to the MUX control circuit 22, the normal address transfer control signal TN is outputted from the MUX control circuit 22 to the MUX 20. As a result, the internal address EX-ADD from the late write register 13 is outputted as a word line address from the MUX 20 through the X predecoder 35 to the X decoder 28.

The X decoder 28 decodes the inputted address X-ADD to activate a relevant word line. Furthermore, Y address latched with the late write register 14 is directly outputted as Y-ADD through the Y predecoder 36 to the Y decoder 25, and selects a bit line for reading data. On the other hand, the row enable normal signal REN is also inputted to the SE/PE control circuit 23, operates the sense amp/precharge circuit connected to the selected bit line, reads data Q? stored in a memory cell situated at an intersection of a word line represented by the address A? in the memory cell array 27 and the bit line, and outputs the same through a write read bus WRB and the Din register/Dout buffer 24.

When the memory read operation is completed, the latch control signal LC falls to the "L" level and by the fall, latch circuits 163 to 165 are reset to turn the output of the NOR gate 167 into the "H" level. When a refresh request trigger is outputted from the refresh timer 18 before next memory access is started, the output of the refresh request signal generator circuit 162 is turned into the "H" level, and a refresh request signal is inputted through the AND gate 168 to the refreshing pulse generator circuit 170. As a result, the row enable refresh signal RERF and the refresh address count-up signal are outputted from the refreshing pulse generator circuit 170, and inputted to the MUX control circuit 22 and SE/PE control circuit 23 and the refresh address counter 21, respectively.

When the refresh address count-up signal is inputted, the refresh address counter 21 outputs a value (An) obtained by counting up X address to be refreshed by 1 for example. When the row enable refresh signal RERF is inputted to the MUX control circuit 22, the MUX control circuit 22 outputs the refresh address transfer control signal TRE to the MUX 20. When the refresh address transfer control signal TRE is inputted to the MUX 20, the MUX 20 selects the refresh address RF-ADD from the refresh address counter 21, and outputs the count value (An) through the X predecoder 35 to the X decoder 28 as a refresh address. The x decoder 28 activates a word line designated with the refresh address (An).

In the case of the refresh operation, Y address is not designated, and therefore when the row enable refresh signal RERF is inputted, the SE/PE control circuit 23 outputs a signal for operating all sense amp/precharge circuits 26. Thus, the refresh (rewrite) operation for all memory cells connected to the word line designated with X address (An) outputted from the MUX 20 is performed by the sense amp/precharge circuit connected to each bit line. Furthermore, as shown in FIG. 5, even if a next memory access request is made during performance of the refresh operation, the memory access operation is performed without considering the refresh operation because the row enable signal REN actually performing memory access is configured to rise with delay beforehand by the delay circuit 166.

Then, if a refresh request trigger is outputted from the refresh timer 18 during performance of the read operation, and the refresh request signal rises to the "H" level (FIG. 6), the output of the NOR gate 167 is at the "L" level because the latch control signal LC outputted from the memory accessing pulse generator circuit 171 is still at the "H" level, the refresh request signal is blocked by the AND gate 168, and therefore the row enable refresh signal RERF and the refresh address count-up signal are not outputted from the refreshing pulse generator circuit 170.

Thereafter, when the memory read operation is completed and the latch control signal LC falls to the "L" level, latch circuits 163 to 165 are reset and the NOR gate 167 rises to the "H" level by this fall and at this time, the refresh request signal is thus inputted to the refreshing pulse generator circuit 170 through the AND gate 168. Thus, the refresh request signal delayed until completion of the memory access operation is inputted to the refreshing pulse generator circuit 170 and after the delayed refresh request signal is inputted, the refreshing pulse generator circuit 170 outputs the row enable refresh signal RERF and the refresh address count-up signal. The subsequent refresh operation is similar to the operation shown in FIG. 5.

Furthermore, only the relation between the read operation and the refresh operation is shown in timing charts of FIGS. 5 and 6, but the relation between the write operation and the refresh operation is basically the same. However, late write writing is performed as write and therefore at the time of write, the row enable normal signal REN is generated from the memory accessing pulse generator circuit 171 when the write enable signal/WE falls to the "L" level, and data captured at the time of the previous write request, which is stored in the data register of the Din register/Dout buffer 24, is written for the address captured at the time of the previous write request, which is stored in late write registers 13 and 14.

When the write enable signal/WE rises to the "H" level, the present write data is captured in the data register of the Din register/Dout buffer 24 by a clock CLK for the Din register. Furthermore, if at the time of memory read, the present memory read request address matches with the write address of data that has not been written yet for the previous write request, the above bypass operation is performed, data stored in the data register of the Din register/Dout buffer 24 is read and outputted, and data read from the memory cell array 27 is discarded.

Figure 7:
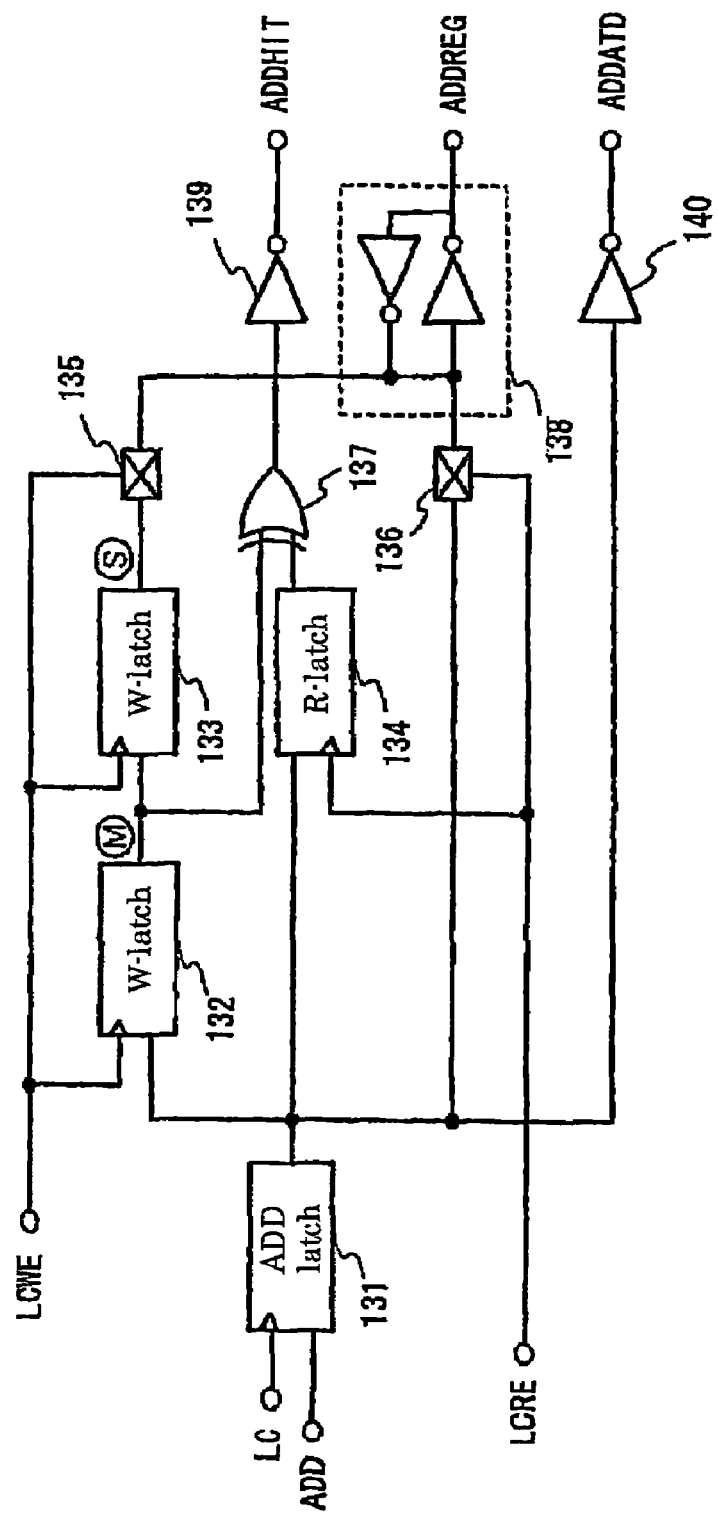
FIG. 7 is a block diagram showing a bitwise configuration of a late write register that is used in this embodiment.

FIG. 7 is a block diagram showing a bitwise configuration of late write registers 13 and 14 that are used in this embodiment. Late write registers 13 and 14 have the configuration equivalent to the bit widths of X address and Y address, respectively.

In FIG. 7, an address latch (hereinafter referred to as ADD-latch) 131 outputs addresses supplied from address buffers 11 and 12 directly as internal addresses as long as the latch control signal LC from the refresh control pulse generator circuit 16 is at the "L" level (time period after the latch control signal LC falls until it rises again), captures addresses supplied from address buffers 11 and 12 at the rise of the latch control signal LC and holds the same as long as the latch control signal LC is at the "H" level, and outputs the held address as internal addresses.

A writing address latch (hereinafter referred to as W-latch) 132 captures the internal address outputted from the ADD latch 131 at the rise of the write latch control signal LCWE from the R/W control circuit 15 and holds the same, and a W-latch 133 captures the internal address held in the W-latch 132 at the fall of the LCWE and holds the same. A reading address latch (hereinafter referred to as R-latch) 134 captures the internal address outputted from the ADD-latch 131 at the rise of the read latch control signal LCRE from the R/W control circuit 15 and holds the same.

A transfer switch 135 conducts and outputs the internal address held in the W-latch 133 as long as the write latch control signal LCWE from the R/W control circuit 15 is at the "H" level. A transfer switch 136 conducts and outputs the internal address held in the ADD-latch 131 as long as the read latch control signal LCRE from the R/W control circuit 15 is at the "H" level. An exclusive OR circuit 137 makes a comparison between the internal address held in the W-latch 132 and the internal address held in the R-latch 134, is at the "L" level when the former and the latter match with each other, and outputs an address hit signal ADDHIT at the "H" level though an inverter 139.

The latch circuit 138 holds the write address or read address outputted through the transfer switch 135 or 136. The held address is outputted through the X predecoder 35 or Y predecoder 36 to the X decoder 28 or Y decoder 25 as a memory access address. Furthermore, the output signal of the ADD-latch 131 is outputted to the one shot pulse generator circuit 161 in the refresh control pulse generator circuit 16 as an address transition signal ADDATD.

Figure 8:
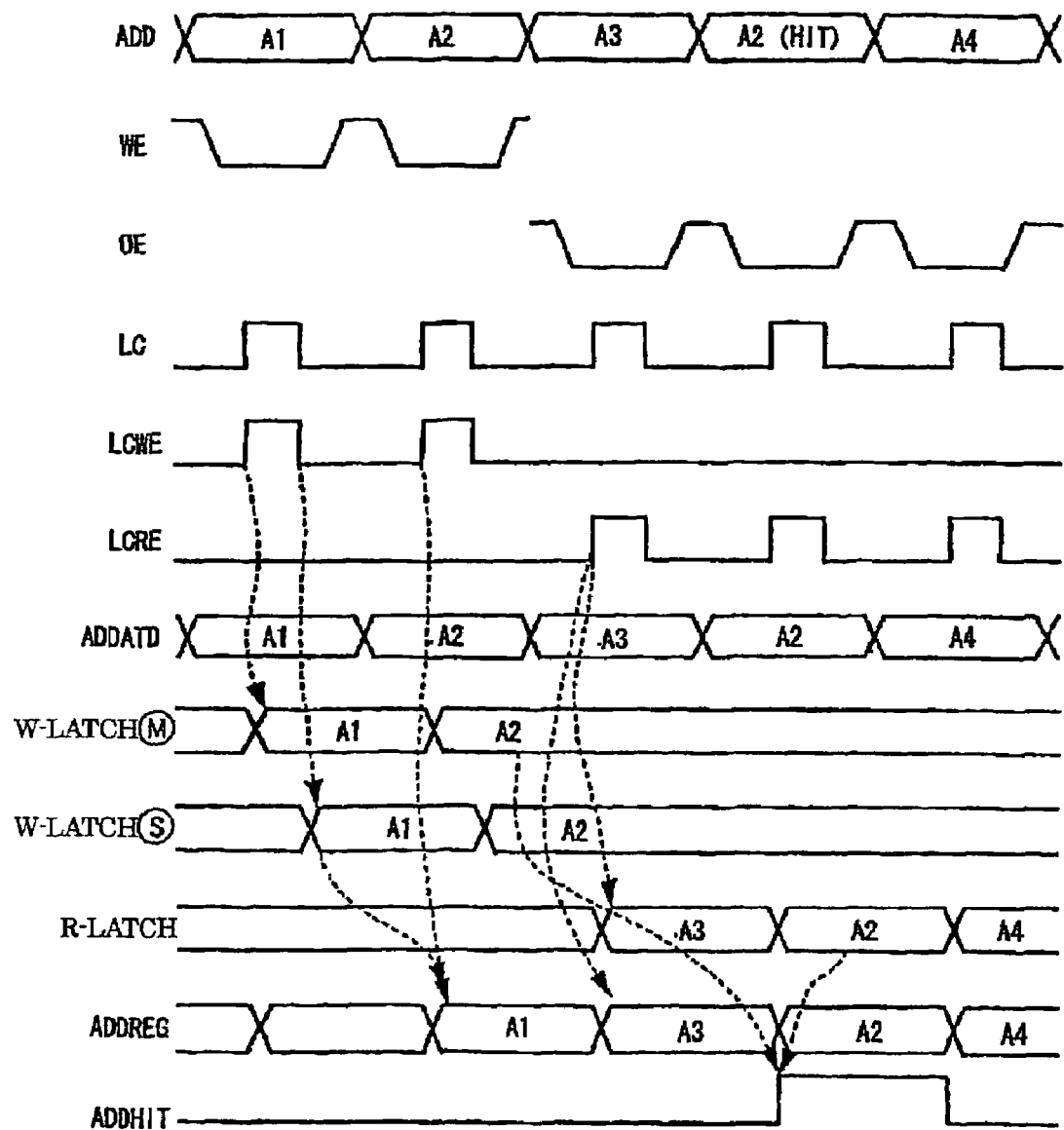
FIG. 8 is a timing chart for explaining operations of the late write register shown in FIG. 7.

FIG. 8 is a timing chart for explaining operations of the late write register shown in FIG. 7. The operations of the late write register in this embodiment will be described below with reference to FIGS. 7 and 8. Furthermore, the timing chart of FIG. 8 shows the case of at least two successive write requests followed by successive read requests.

When a request for write of data in a memory cell of an address A1 is made from outside, a change in an address signal inputted to the late write register is outputted through the ADD-latch 131 to the one shot pulse generator circuit 161 of the refresh control pulse generator circuit 16 as an ADDATD signal (FIG. 4), and the latch control signal LC is outputted from the refresh control pulse generator circuit 16. The ADD-latch 131 latches the write address A1 by the latch control signal LC. The W-latch 132 captures the write address A1 at the rise of the write latch control signal LCWE synchronized with the latch control signal LC and holds the same, and the W-latch 133 captures the write address A1 held by the W-latch 132 at the rise of the LCWE and holds the same.

The transfer switch 135 is turned ON to transfer the write address A1 held by the W-latch 133 to the latch circuit 138 when the LCWE is at the "H" level. Thus, the write address A1 is not transferred to the latch circuit 138 at the time when the W-latch 132 captures the address A1. Then, when a request for write of data in a memory cell of an address A2 is made from outside, similarly, the latch control signal LC is outputted from the refresh control pulse generator circuit 16, and the ADD-latch 131 latches the write address A2 by the latch control signal LC.

The W-latch 132 captures the write address A2 at the rise of the write latch control signal LCWE synchronized with the latch control signal LC and holds the same but at this time, by the write latch control signal LCWE, the transfer switch 135 is turned ON to transfer the write address A1 held by the W-latch 133 to the latch circuit 138. Thus, at the time when the write address A2 is latched, the write address A1 previously inputted and held by the W-latch 133 is inputted to the X decoder 28 and the Y decoder 25 as a memory accessing address, and write by late write is performed. Furthermore, the W-latch 133 captures the next write address A2 held by the W-latch 132 at the fall of the LCWE and holds the same.

Then, when a request for read of data of a memory cell of an address A3 is made from outside, similarly, the latch control signal LC is outputted from the refresh control pulse generator circuit 16, and the ADD-latch 131 latches the read address A3 by the latch control signal LC. The R-latch 134 captures the read address A3 at the rise of the read latch control signal LCRE synchronized with the latch control signal LC and holds the same, and outputs the held read address A3 to the exclusive OR circuit 137. The exclusive OR circuit 137 makes a comparison between the inputted read address A3 and the write address A2 held by the W-latch 132 but in this case, the former and the latter do not match with each other and the output of the circuit is therefore at the "H" level, and the address hit signal ADDHIT outputted from the inverter 139 is at the "L" level indicating a mismatch. Furthermore, by the read latch control signal LCRE, the transfer switch 136 is turned on to transfer the read address A3 held by the ADD-latch 131 to the latch circuit 138.

Then, when a request for read of data of the memory cell of the address A2 is made from outside, similarly, the latch control LC is outputted from the refresh control pulse generator circuit 16, and the ADD-latch 131 latches the read address A2 by the latch control signal LC. The R-latch 134 captures the read address A2 at the rise of the read latch control signal LCRE synchronized with the latch control signal LC and holds the same, and outputs the held read address A2 to the exclusive OR circuit 137. The exclusive OR circuit 137 makes a comparison between the inputted read address A2 and the write address A2 held by the W-latch 132 but in this case, the former and the latter match with each other and the output of the circuit is at the "L" level, and the "H" level indicating a match is outputted from the inverter 139 as the address hit signal ADDHIT.

The address hit signal ADDHIT is inputted to the address hit control circuit 19 (FIG. 3). The address hit control circuit 19 performs control so that when the "H" level is inputted as the address hit signal ADDHIT, the hit signal HITS for the Din register/Dout buffer 24 is turned into the "H" level, and data stored in the Din register is outputted as read data. Furthermore, in this case, the transfer switch 136 is turned ON by the latch control signal LCRE, so that the read address A2 held by the ADD-latch 131 is transferred to the latch circuit 138, and data of the memory cell of the address A2 is read, but the read data is discarded.

Figure 9:
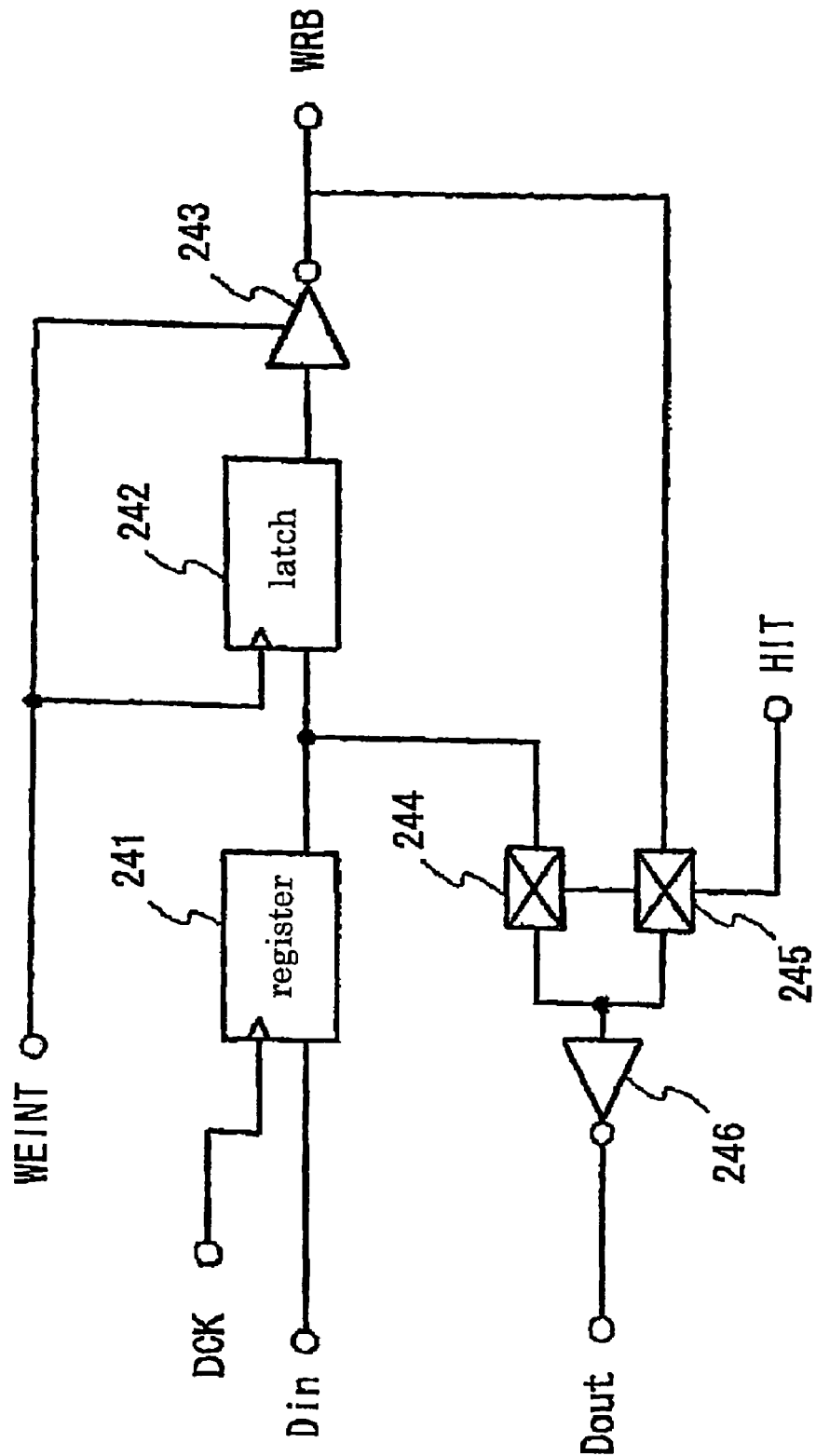
FIG. 9 is a block diagram showing a bitwise configuration of a Din register/Dout buffer that is used in this embodiment.

FIG. 9 is a block diagram showing a bitwise configuration of the Din/Dout buffer 24 that is used in this embodiment. The Din register/Dout buffer 24 has the configuration equivalent to the bit width of data.

In FIG. 9, a data capturing register (hereinafter referred to as D-register) 241 captures data inputted to a data input terminal at the fall of a data capturing internal clock DCK from the data I/O control circuit 17. The data capturing internal clock DCK is made from a rising edge of the write enable signal/WE. A data writing latch (hereinafter referred to as D-latch) 242 directly outputs data stored in the D-register 241 as long as a data writing internal clock WEINT from the data I/O control circuit is at the "L" level, latches data at the rise of the data writing internal clock WEINT to the "H" level, and outputs the data through an inverter 243 to a data writing and reading bus (hereinafter referred to as bus WRB).

The inverter 243 goes into an operating state to transfer data latched by the D-latch 242 to the bus WRB when the data writing internal clock WEINT is at the "H" level. A transfer switch 244 is turned ON to output data stored in the D-register 241 through an inverter 246 to a data output terminal when the hit signal HITS at the "H" level indicating an address match is inputted from the address hit control circuit 19. On the other hand, a transfer switch 245 is turned ON to data read onto the bus WRB from the memory cell array 27 to the output terminal through the inverter 246 when the hit signal HITS at the "L" level indicating an address mismatch is inputted from the address hit control circuit 19.

Figure 10:
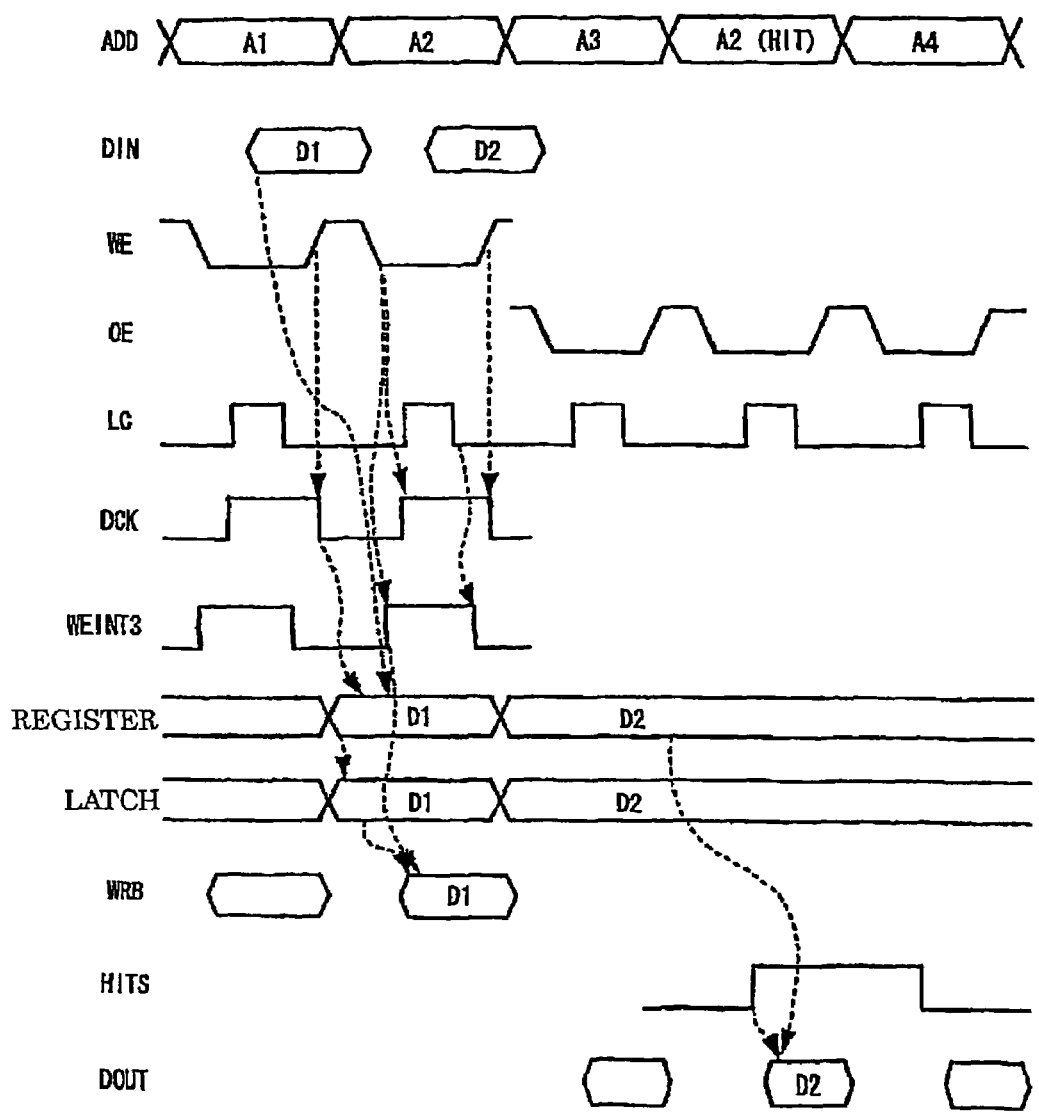
FIG. 10 is a timing chart for explaining operations of the Din register/Dout buffer shown in FIG. 9.

FIG. 10 is a timing chart for explaining operations of the Din register/Dout buffer shown in FIG. 9. The operations of the Din register/Dout buffer in this embodiment will be described below with reference to FIGS. 9 to 10. Furthermore, the timing chart of FIG. 10 shows the case of two successive write requests followed by successive read requests.

When a request for write of data D1 in the memory cell of the address A1 is made from outside, the write enable signal/WE rises, the data writing internal clock WEINT is turned into the "H" level by the rise of the signal/WE, the D-latch 242 latches data Dx previously stored in the D-register 241, and the inverter 243 transfers the latched data Dx to the bus WRB as write data. Thereafter, data D1 from the data input terminal is stored in the D-register 241 at the time when the write enable signal/WE rises and the data capturing internal clock DCK falls. At this time, the data writing internal clock WEINT is at the "L" level, and therefore the D-latch 242 does not latch data, and the inverter 243 is in an inactive state, and therefore data D1 is not transferred to the bus WRB.

Then, when a write request of data D2 in the memory cell of the address A2 is made from outside, the write enable signal/WE falls, the data writing internal clock WEINT is turned into the "H" level by the fall of the signal/WE, the D-latch 242 latches data D1 previously stored in the D-register 241, and the inverter 243 transfers the latched data D1 to the bus WRB as write data. Thereafter, data D2 from the data input terminal is stored in the D register 241 at the time when the write enable signal/WE rises and the data capturing internal clock DCK falls. At this time, the data writing internal clock WEINT is at the "L" level, and therefore the D-latch 242 does not latch data, and the inverter 243 is in an inactive state, and therefore data D2 is not transferred to the bus WRB.

Then, when a request for read of data from the memory cell of the address A3 is made from outside, the output enable signal/OE falls, and data is read from the memory cell of the address A3 by the fall of the signal/OE. Furthermore, at this time, because the hit signal HITS from the address hit control circuit 19 is at the "L" level indicating an address mismatch, the transfer switch 244 is OFF and the transfer switch 245 is ON, and data read onto the bus WRB from the memory cell of the address A3 in the memory cell array 27 is outputted to the data output terminal through the inverter 246.

Then, when a request for read of data from the memory cell of the address A2 is made from outside, the output enable signal/OE falls, and data is read from the memory cell of the address A2 by the fall of the signal/OE. At this time, however, because the hit signal HITS from the address hit control circuit 19 is at the "H" level indicating an address match, the transfer switch 244 is ON and the transfer switch 245 is OFF. Thus, data D2, which is stored in the D-register 241 and is not written yet in the memory cell in the memory cell array 27, is outputted to the data output terminal through the transfer switch 244 and the inverter 246.

Data read from the memory cell of the address A2 in the memory cell array 27 has its output blocked by the transfer switch 245 and is discarded. Furthermore, data D2, which is stored in the D-register 241 and is not written yet in the memory cell, is stored in the D-register 241 until a next write request is made from outside, and is written in the address A2 in the memory cell array 27 by late write when the write request is made.

Figure 11:
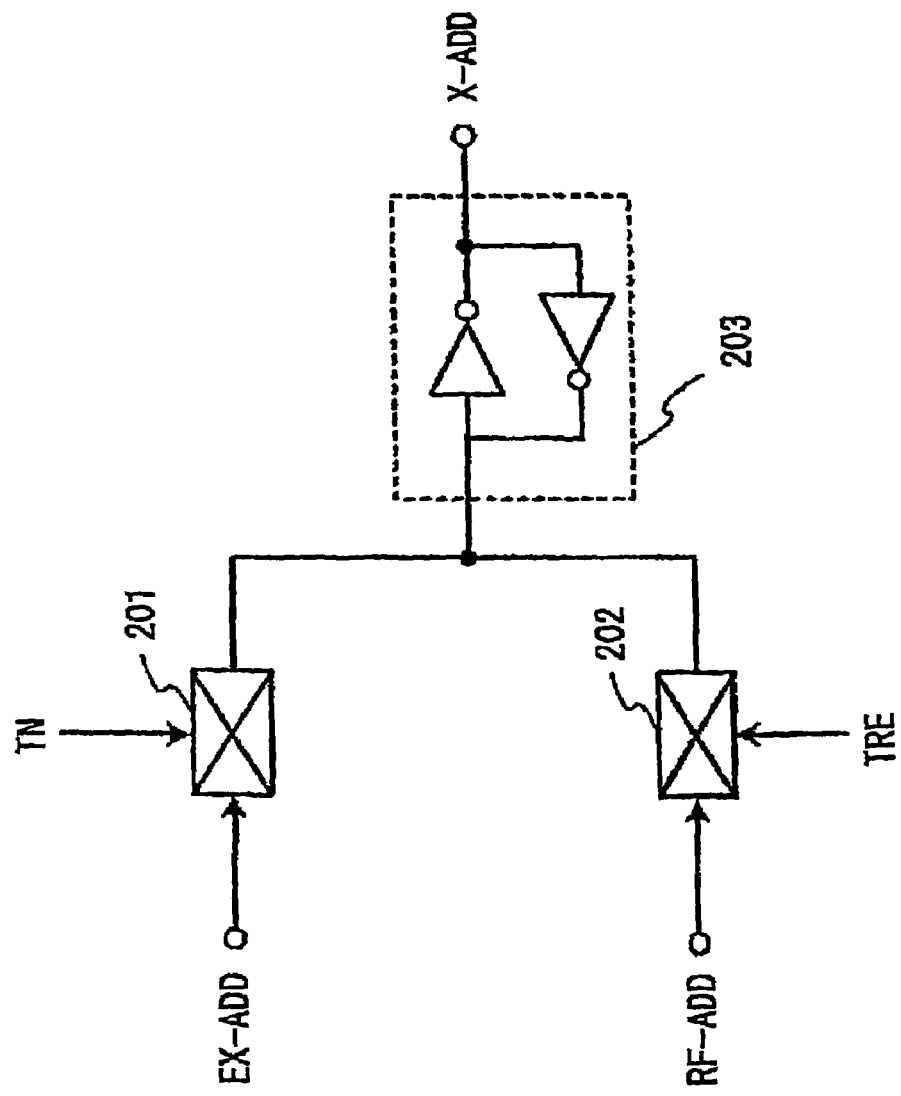
FIG. 11 is a block diagram showing a bitwise configuration of a multiplexer (MUX) that is used in this embodiment.

FIG. 11 is a block diagram showing a bitwise configuration of the multiplexer (MUX) 20 that is used in this embodiment. The MUX 20 has the configuration equivalent to the bit width of X address.

In FIG. 11, a transfer switch 201 is turned ON to transfer to a latch circuit 203 an internal address EX-ADD outputted from the late write register 13 for X address when the normal address transfer control signal TN outputted from the MUX control circuit 22 is at the "H" level. A transfer switch 202 is turned ON to transfer to the latch circuit 203 a refresh address RF-ADD outputted from the refresh address counter 21 when the refresh address transfer control signal TRE outputted from the MUX control circuit 22 is at the "H" level. The latch circuit 203 holds the internal address EX-ADD or refresh address RF-ADD transferred the transfer switch 201 or transfer switch 202, and outputs the same through the X predecoder 35 to the X decoder 28 as X address X-ADD.

The normal address transfer control signal TN or refresh address transfer control signal TRE is at the "H" level only when the address is captured, the transfer switch 201 or transfer switch 202 is kept ON to perform control to transfer the internal address EX-ADD or refresh address RF-ADD to the latch circuit 203 only for this period, and otherwise the normal address transfer control signal TN and the refresh address transfer control signal TRE are kept at the "L" level, whereby unnecessary current outputs from the late write register 13 for X address or refresh address counter 21 are restricted to reduce current consumption.

Figure 12:
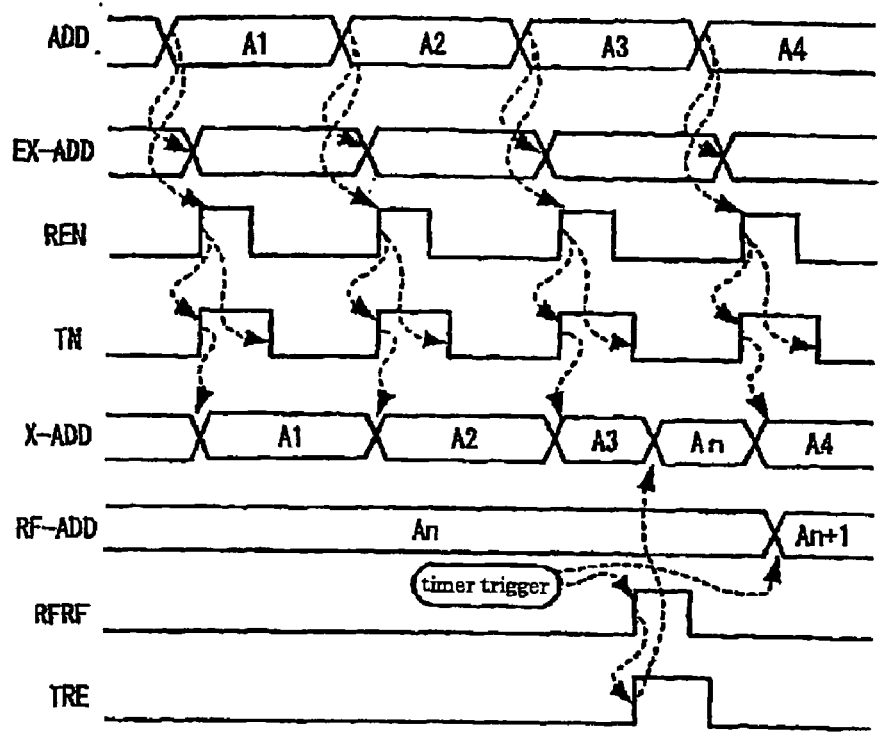
FIG. 12 is a timing chart for explaining operations of the MUX circuit shown in FIG. 11.
Figure 12:
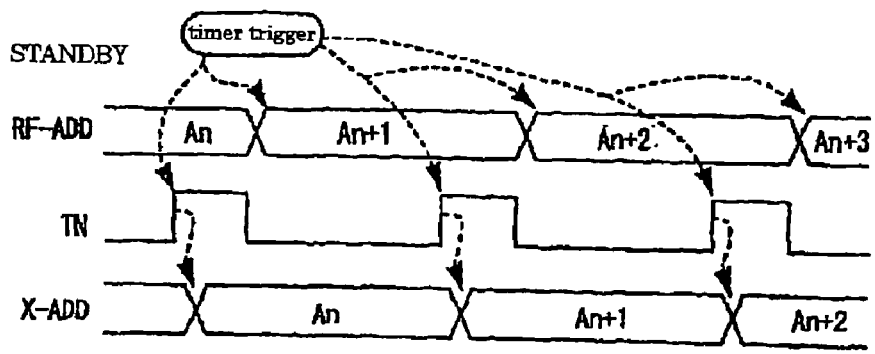

FIG. 12 is a timing chart for explaining operations of the MUX circuit shown in FIG. 11. The operation of the MUX circuit during normal read/write and the operation during a standby mode for performing memory refresh in this embodiment will be described with reference to FIGS. 11 and 12. Furthermore, in FIG. 12, the operation during memory read is shown, but the operation during write is basically the same except that the late write operation is performed.

When a request for memory access to the memory cell of the address A1 is made from outside during normal read, this address transition causes the address A1 to be outputted from the late write register 13 for X address as the internal address EX-ADD. On the other hand, this address transition causes the row enable normal signal REN to be outputted from the refresh control pulse generator circuit 16 to the MUX control circuit 22. In response to input of the row enable normal signal REN, the MUX control circuit 22 outputs to the transfer switch 201 the normal address transfer control signal TN which is at the "H" level for a certain period. The latch circuit 203 latches the address A1 inputted through the transfer switch 201 during the period over which the normal address transfer control signal TN is at the "H" level, and outputs the same as X address A1.

Then, when a request for memory access to the memory cell of the address A3 is made from outside, similarly, the latch circuit 203 latches the address A3 inputted through the transfer switch 201 during the period over which the normal address transfer control signal TN is at the "H" level, and outputs the same as X address A3. At this time, if a refresh request trigger from the refresh timer 18 is generated, and the row enable refresh signal RERF is outputted from the refresh control pulse generator circuit 16, the MUX control circuit 22 outputs to the transfer switch 202 the refresh address transfer control signal TRE which is at the "H" level for a certain period, in response to the row enable refresh signal RERF.

The latch circuit 203 latches the refresh address An from the refresh address counter 21 inputted through the transfer switch 202 during the period over which the refresh address transfer control signal TRE is at the "H" level, and outputs the same as X address An. Thereafter, the refresh address counter 21 counts up the refresh address to An+1 in response to a count-up signal from the refresh control pulse generator circuit 16.

On the other hand, during the standby mode in which the refresh operation is performed, a refresh request trigger is generated from the refresh timer 18 on a regular basis and in association therewith, the row enable refresh signal RERF is outputted from the refresh control pulse generator circuit 16. In response to the row enable refresh signal RERF, the MUX control circuit 22 outputs to the transfer switch 202 the refresh address transfer signal TRE which is at the "H" level for a certain period. The latch circuit 203 latches the refresh address RF-ADD from the refresh address counter 21 inputted through the transfer switch 202 during the period over which the refresh address transfer control signal TRE is at the "H" level, and outputs the same as X address.

In response to a count-up signal from the refresh control pulse generator circuit 16, the refresh address counter 21 sequentially counts up the refresh address. Furthermore, the refresh timer 18 sets a refresh timer cycle during an active mode to be shorter than a refresh timer cycle during a standby mode involving refresh as a timer cycle in which its refresh request trigger is generated, and switching can be done from one to another according to mode switching from outside. If the bit line is accessed during the active mode, variations in potential of the bit line (disturb) increase to destabilize a held potential, and therefore memory holding time tends to decrease. Thus, the refresh cycle is shorter during the active mode than during the standby mode involving refresh.

Figure 13:
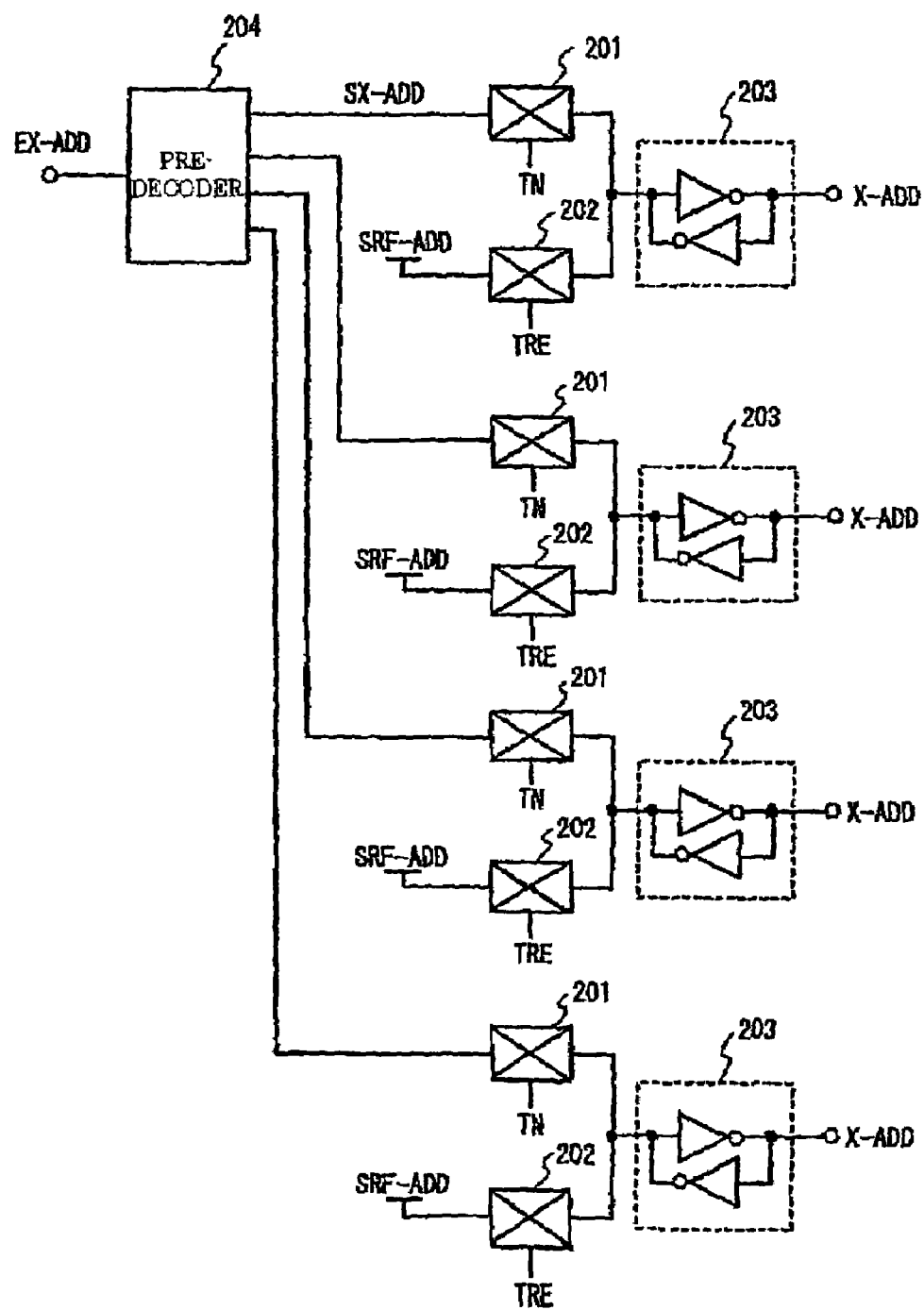
FIG. 13 is a bitwise block diagram showing another configuration of the multiplexer (MUX) that is used in this embodiment.

FIG. 13 is a block diagram showing the bitwise configuration of the multiplexer (MUX) 20 and so on that are used in this embodiment. This configuration is applied when a memory chip is divided into a plurality of sub-arrays (4 sub-arrays in the figure), and an independent X decoder, Y decoder and sense amp precharge circuit are provided for each sub-array. In this case, by performing multi-word selection in which one word line is selected from each sub-array during refresh, a plurality of word lines can be activated by one word line activation operation, and therefore the number of operations at control circuit portions can be reduced, thus making it possible to reduce power consumption accordingly.

In FIG. 13, the predecoder 204 decodes the upper two bits of the internal address EX-ADD inputted from the late write register 13, thereby outputting X address SX-ADD destined 4 sub-arrays. Each transfer switch 201 connected to an output terminal destined for each sub-array of the predecoder 204 is turned ON to transfer X address SX-ADD destined for each sub-array to each latch circuit 203 when the normal address transfer control signal TN outputted from the MUX control circuit 22 is at the "H" level. Each transfer switch 202 is turned ON to transfer to each latch circuit 203 the refresh address SRF-ADD outputted from the refresh address counter 21 when the refresh address transfer control signal TRE outputted from the MUX control circuit 22 is at the "H" level.

Each latch circuit 203 holds the X address SX-ADD or refresh address SRF-ADD destined for each sub-array, transferred through the transfer switch 201 or transfer switch 202, and outputs the same to the X decoder 28 of each sub-array as X address X-ADD. According to the configuration of FIG. 13, the memory refresh may comprise the refresh address counter 21 matching a decode signal after being pre-decoded by the predecoder 204, and activation control of word lines selected from a plurality of sub-arrays can be performed at a time, thus making it possible to reduce the number of operations for activation control of word lines. The word line activation control operation itself involves power consumption and therefore if the number of control operations is reduced, power consumption can be reduced accordingly.

Figure 14:
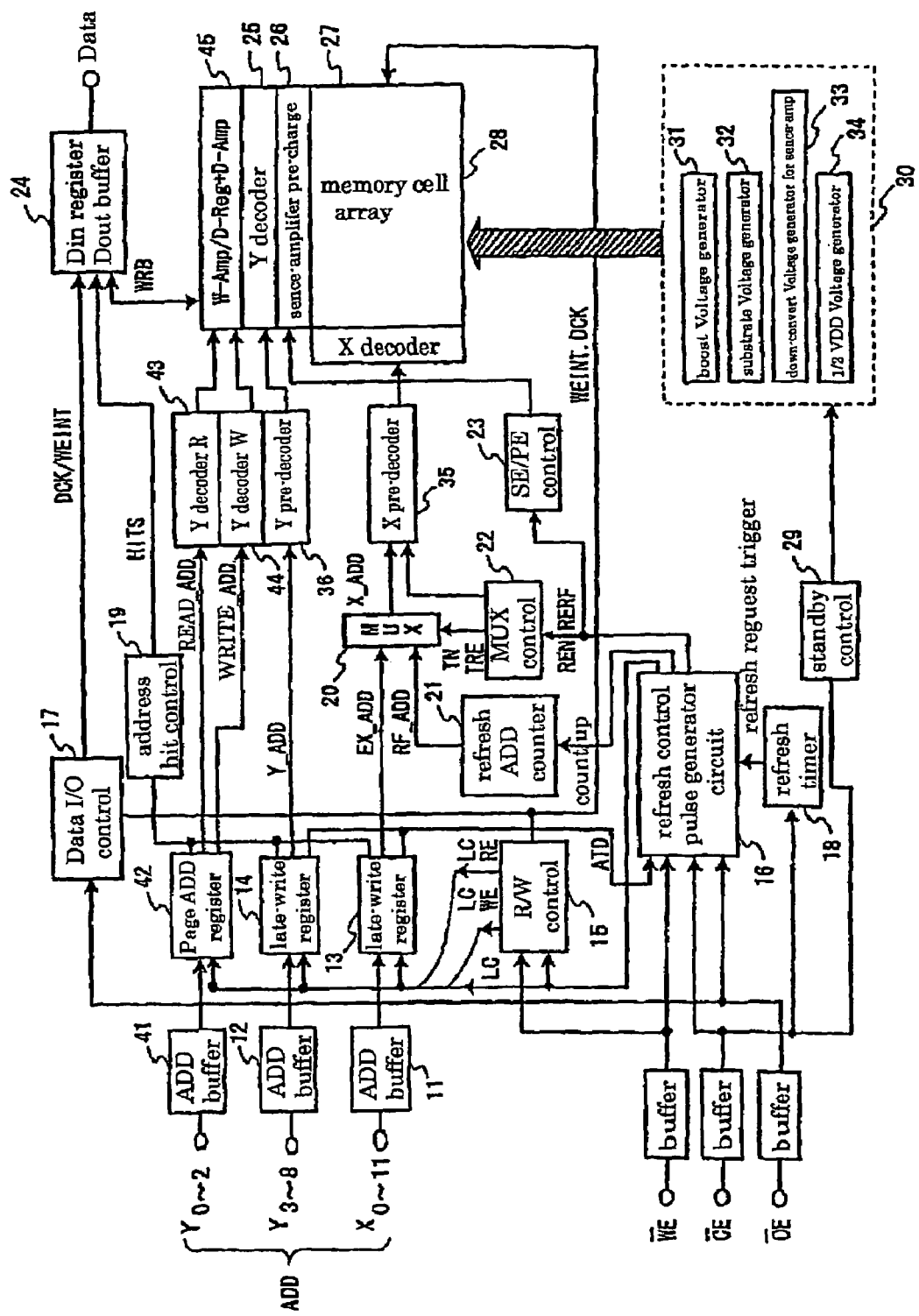
FIG. 14 is a block diagram showing a configuration of a semiconductor memory device of the second embodiment of the present invention.

FIG. 14 is a block diagram showing a configuration of the semiconductor memory device according to the second embodiment of the present invention. In this embodiment, a function similar to a page mode employed in a general-purpose DRAM is added to the first embodiment. In this embodiment, blocks given numbers same as those of the first embodiment shown in FIG. 3 are comprised of same elements except that the bit width of Y address is divided into page addresses and addresses for directly accessing the memory cell array, and therefore detailed descriptions of overlapping parts are not provided.

In this embodiment, Y address is divided into addresses Y3 to Y8 on the upper bit side and addresses Y0 to Y2 (page addresses) on the lower bit side, whereby input/output can be continuously performed only by changing the page address for bits identical in address on the upper bit side. In Example shown in the figure, the page address is of 3 bit width and therefore by making the address variable within the range of "000" B to "111" B ("B" refers to a binary number), data of continuous 8 addresses can be continuously accessed within the same memory cycle. Furthermore, the width of the page address may be freely set as long as it is within the bit width of Y address.

In FIG. 14, has 3 bits as page addresses, of 9 bits, so that an address buffer 12 has 6 bits as a bit width, and lower 3 bits are inputted to an address buffer 41. The address buffers 11, 12 and 41 have same configurations except that they are mutually different in bit width of the address. Furthermore, in Example, lower 3 bits are page addresses and therefore from the memory cell array 27, 8 bit lines are selected at a time and read or write is continuously performed. Then, for performing switching of connection between the bus WRB and the sense amp/precharge circuit 26 of each bit line, an Y decoder for read page addresses 43, a Y decoder for write page addresses 44 and a page write read circuit 45 are provided.

The output of the address buffer 41 is inputted to a page address register 42. As described later, the page address register has no ATD output and requires neither an address latch by the latch control signal LC nor an address latch by the latch control signal LCRE. The page address for read from the page address register 42 is inputted to the Y decoder for read page addresses 43, and the page address for write from the page address register 42 is inputted to the Y decoder for write page addresses 44. The decode outputs of the Y decoder for read page addresses 43 and the Y decoder for write page addresses 44 are inputted to the page write read circuit 45.

The page write read circuit 45 comprises 8 write amps (W-amp) having their output terminals connected sense amps having a common page address for each page and amplifying data from the Din register/Dout buffer 24, and 8 read data amps (D-Reg+D-Amp) having their input terminals connected to sense amps having a common page address for each page and storing and amplifying data read from the memory cell array and outputting the same to the Din register/Dout buffer 24. For the 8 write amps W-amp and read data amps D-Ref+D-Amp, only a write amp W-Amp or read data amp D-Reg+D-Amp selected by decoding an inputted write page address or read page address by the Y decoder for write page addresses 44 or Y decoder for read page addresses 43 is activated to operate under control by the data capturing internal clock DCK or data writing internal clock WEINT, and outputs write data inputted from the bus WRB to the relevant bit line, or outputs data read onto the relevant bit line to the bus WRB.

Figure 15:
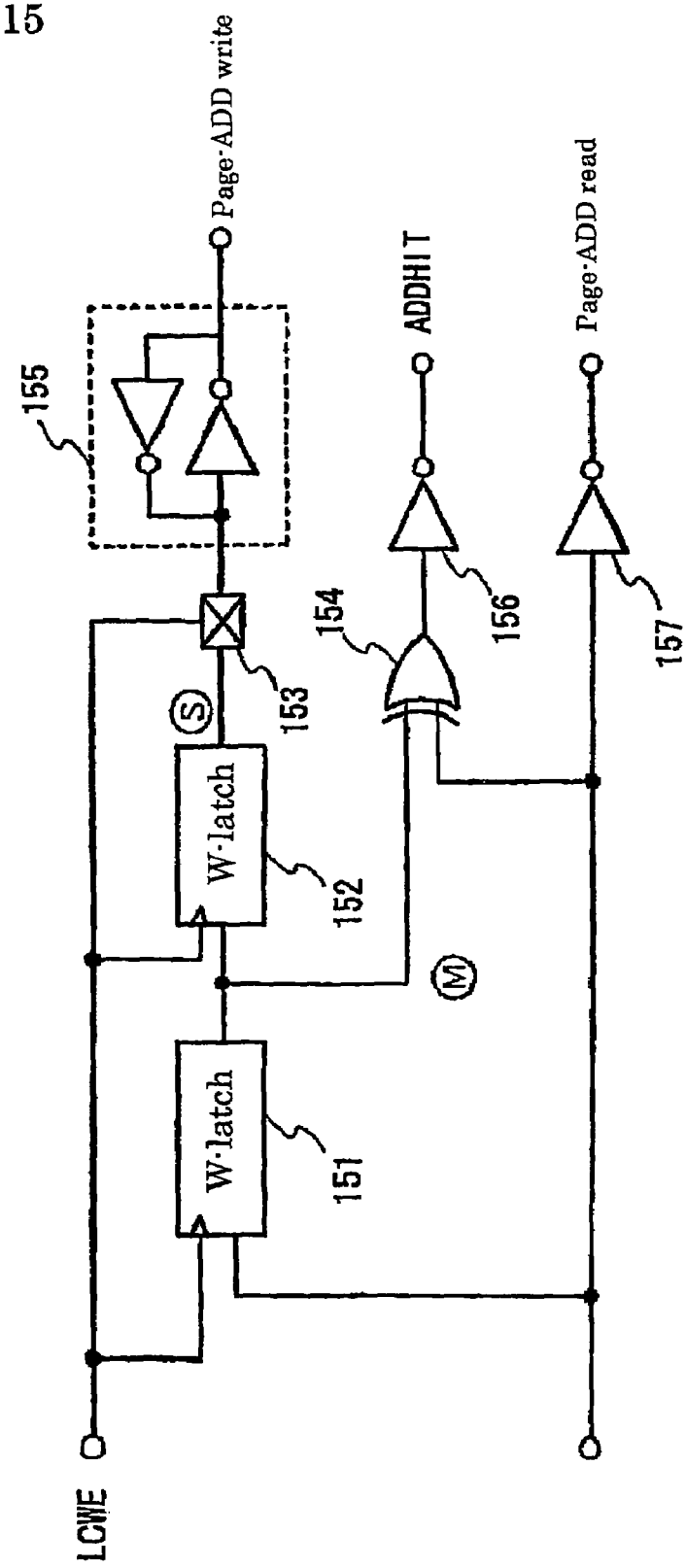
FIG. 15 is a block diagram showing a bitwise configuration of a page address register that is used in the second embodiment.

FIG. 15 is a block diagram showing a bitwise configuration of the page address register 42 that is used in this embodiment. In FIG. 15, a writing address latch (W-latch) 151 captures a page address outputted from the address buffer 41 at the rise of the write latch control signal LCWE from the R/W control circuit 15 and holds the same, and a W-latch 152 captures the internal page address held by the W-latch 151 at the fall of the signal LCWE and holds the same. A transfer switch 153 conducts to output the internal page address held by the W-latch 152 when the write latch control signal LSWE from the R/W control circuit 15 is at the "H".

An exclusive OR circuit 154 makes a comparison between the internal page address held by the W-latch 151 and the page address outputted from the address buffer 41, is at the "L" level when the former and the latter match with each other, and outputs the address hit signal ADDHIT at the "H" level through an inverted 156. The latch circuit 155 holds the write address outputted through the transfer switch 153 and outputs the same to the Y decoder for write page addresses 44. Furthermore, at the time of read, the address outputted from the address buffer 41 is directly outputted to the Y decoder for page addresses 43 through an inverter 157 as a page address.

Figure 16:
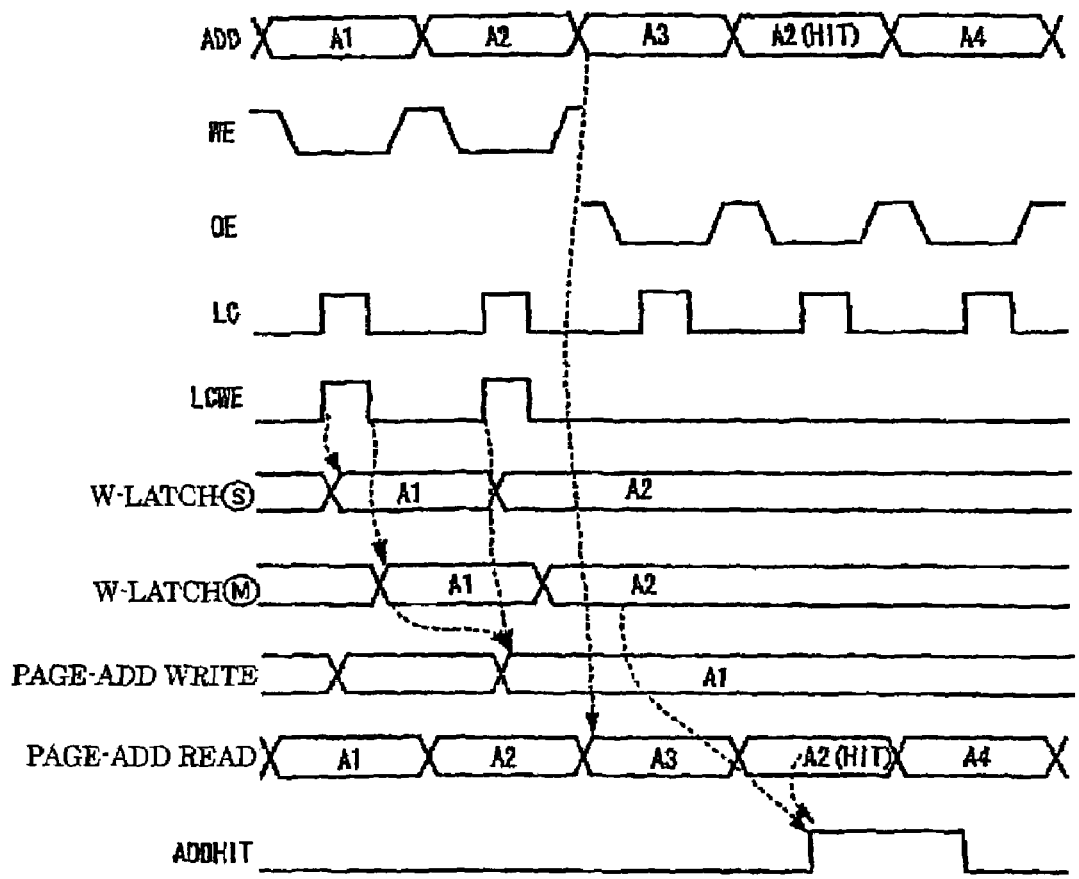
FIG. 16 is a timing chart for explaining operations of the page address register shown in FIG. 15.

FIG. 16 is a timing chart for explaining operations of the page address register shown in FIG. 15. Operations of the late write register in this embodiment will be described below with reference to FIGS. 15 to 16. Furthermore, the timing chart of FIG. 15 shows an example of the case of two successive write requests followed by successive read requests.

When a request for write of data in the memory cell of the address A1 is made from outside, the ADDATD signal is outputted to the refresh control pulse generator circuit 16 (FIG. 4), and the latch control signal LC is outputted from the refresh control pulse generator circuit 16, by a change in address signals inputted to late write transistors 13 and 14. The W-latch 151 captures the page address of the write address A1 at the rise of the write latch control signal LCWE synchronized with the latch control signal LC and holds the same, and the W-latch 152 captures the page address of the write address A1 held by the W-latch 151 at the fall of the signal LCWE and holds the same. The transfer switch 153 is turned ON to transfer to the latch circuit 155 the page address of the write address A1 held by the W-latch 151 when the signal LCWE is at the "H" level. Thus, at the time when the W-latch 151 captures the page address of the write address A1, the page address of the write address A1 is not transferred to the latch circuit 155.

Then, when a request for write of data in the memory cell of the address A2 is made from outside, similarly, the latch control signal LC is outputted from the refresh control pulse generator circuit 16, and the W-latch 151 captures the page address of the write address A2 at the rise of the write latch control signal LCWE synchronized with the latch control signal LC but at this time, the transfer switch 153 is turned ON by the write latch control signal LCWE to transfer to the latch circuit 155 the previous page address of the write address A1 held by the W-latch 151. Thus, at the time when the page address of the write address A2 is latched, the page address of the write address A1 previously inputted and held by the W-latch 151 is inputted to the Y decoder for write page addresses 44 as a page address for write, and write by late write is performed. Furthermore, the W-latch 152 captures the next page address of the write address A2 held by the W-latch 151 at the fall of the signal LCWE and holds the same.

Then, when a request for read of data of the memory cell of the address A3 is made from outside, similarly, the latch control signal LC is outputted from the refresh control pulse generator circuit 16, but the read latch control signal LCRE is not inputted to the page address register and thus, the page address of the read address A3 is directly inputted to the exclusive OR circuit 154, and outputted to the Y decoder for read page addresses 44 through the inverter 157 as a page address for read. The exclusive OR circuit 154 makes a comparison between the inputted page address of the read address A3 and the page address of the write address A2 held by the W-latch 151 but in this case, because the former and the latter do not match with each other, its output is at the "H" level, and the address hit signal ADDHIT outputted from the inverter 156 is at the "L" level indicating a mismatch.

Then, when a request for read of data of the memory cell of the address A2 is made from outside, similarly, the page address of the read address A2 is directly inputted to the exclusive OR circuit 154, and outputted to the Y decoder for read page addresses 44 through the inverter 157 as a page address for read. The exclusive OR circuit 154 makes a comparison between the inputted page address of the read address A2 and the page address of the write address A2 held by the W-latch 151 but in this case, because the former and the latter matches with each other, its output is at the "L" level, and the "H" level indicating a match is outputted from the inverter 156 as the address hit signal ADDHIT. The address hit signal ADDHIT is inputted to the address hit control circuit 19 (FIG. 14). When the "H" level is inputted as the address hit signal ADDHIT, the address hit control circuit 19 reads data stored in the Din register and outputs the same as data to the Din register/Dout buffer 24.

Figure 17:
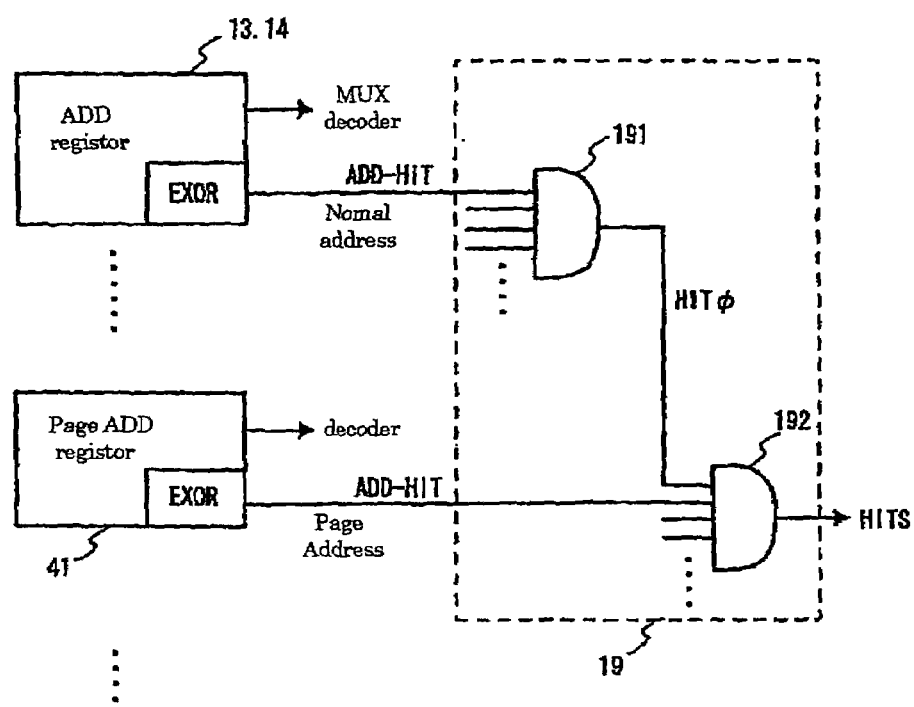
FIG. 17 is a block diagram showing a configuration of an address hit control circuit that is used in this embodiment.

FIG. 17 is a block diagram showing a configuration of the address hit control circuit 19 that is used in this embodiment. The address hit control circuit is comprised of AND gates 191 and 192. The AND gate 191 outputs the logical sum of all address hit signals ADDHIT outputted from the exclusive OR circuit 137 of late write registers 13 and 14 configured according to FIG. 7 for each address bit. The AND gate 192 outputs the logical sum of the output of the AND gate 191 and all address hit signals ADDHIT outputted from the exclusive OR circuit 154 of the page address register 42 configured according to FIG. 15 for each page address bit.

In the page address register, much time is taken until all address hit signals ADDHIT are outputted because a plurality of addresses are inputted in one memory cycle. Thus, the logical sum of determination signals HIT? according to the logical sum of address hit signals ADDHIT other than the page address and address hit signals ADDHIT of the page address is taken and hit signals HITS are outputted, whereby the speed of a hit signal generation path from the page address is enhanced, and the speed and stability of the hit signal output are enhanced.

INDUSTRIAL APPLICABILITY

The present invention employs a method and circuit configuration in which a refresh operation for a memory cell array is performed independently of a memory cell access operation and if the refresh operation collides with the memory access operation, the refresh operation is delayed until the colliding memory access operation is completed, so that power consumption associated with the refresh operation can be reduced by performing the minimum refresh operation, and the refresh operation can be reliably performed without affecting memory access.

Furthermore, in the present invention, a write operation by late write is performed if memory access is a write request, and therefore the refresh operation can be well performed within the memory cycle whether the colliding memory access is a read request or write request, thus making it possible to perform memory access without considering the memory refresh operation.

What is claimed is:

1. A semiconductor memory device having a memory cell array comprised of memory cells requiring refresh, in which a read request or write request is asynchronously given for an access address, wherein the semiconductor memory device comprises:
   a refresh timer periodically outputting a refresh request signal for said memory cell array;
   a late write writing control circuit that writes, for said write request, an access address and write data for a write request given in a memory cycle before a memory cycle for the write request by a late write operation; and
   a refresh control circuit performing a refresh operation for said memory cell array in response to the refresh request signal from said refresh timer, and delaying performance of said refresh operation until a read operation or the late write operation for a memory cell for the read request or the write request is completed when said refresh request signal collides with said read request or said write request, wherein said refresh control circuit includes circuitry that generates a control signal for said refresh operation and a control signal for said read operation or said late write operation based on (i) said refresh request signal and (ii) a delay signal responsive to the colliding of said read request or said write request with said refresh request signal.

2. The semiconductor memory device according to claim 1, wherein said refresh timer has a timer switching capability of setting a timer cycle during an active mode to be shorter than a timer cycle during a standby mode involving a refresh operation as a timer cycle in which its refresh request trigger is generated.

3. (Original) The semiconductor memory device according to claim 1, wherein said refresh control circuit comprises:

a refresh control pulse generator circuit having a capability of inputting a memory accessing enable signal, an address transition detection signal from a late write register storing memory access addresses, a refresh request trigger from said refresh timer and outputting a latch control signal controlling a latch operation of memory access addresses, a refresh address count-up signal, and a row enable normal signal and row enable refresh signal, and delaying the output of said row enable refresh signal until said latch control signal falls when the refresh request signal from said refresh timer is inputted during output of said latch control signal;

a refresh address counter inputting the refresh address count-up signal outputted from said refresh control pulse generator circuit to count up the refresh address;

a multiplexer inputting a row address (X address) of said memory access addresses and a refresh address outputted from said refresh address counter, and switch-wise outputting any one of the addresses to an X decoder as X address;

a MUX control circuit inputting the row enable normal signal and row enable refresh signal outputted from said refresh control pulse generator circuit, and outputting to said multiplexer a normal address transfer control signal and refresh address transfer control signal controlling the switching of the X address outputted from said multiplexer; and sense enable/precharge enable control circuit controlling a sense amp/precharge circuit of said memory by the row enable normal signal and row enable refresh signal outputted from said refresh control pulse generator circuit.

4. A semiconductor memory device having a memory cell array comprised of memory cells requiring refresh, the semiconductor memory device comprising:

a refresh request generator circuit generating a refresh request independently of a read request or write request for said memory cells; and a refresh control circuit delaying performance of a refresh operation until a read operation or write operation for said memory cells for said read request or write request is completed when the refresh request from said refresh request generator circuit collides with said read request or write request, wherein said refresh control circuit includes circuitry that generates a control signal for said refresh operation and a control signal for said read operation or said write operation based on (i) said refresh request signal and (ii) a delay signal responsive to the colliding of said read request or said write request with said refresh request signal.

5. The semiconductor memory device according to claim 4, wherein the write operation of performing said write operation is a late write operation of writing an access address and write data for a write request given in a memory cycle before a memory cycle for said write request.

6. The semiconductor memory device according to claim 5, further comprising an address storing apparatus storing the present write request address, and an address hit control circuit making a comparison between the read request address and the write request address stored said address storing apparatus at the time of the previous write request, and outputting an address hit signal when the former and the latter match each other.

7. A semiconductor memory device having a memory cell array comprised of memory cells requiring refresh the semiconductor memory device comprising:

a refresh request generator circuit generating a refresh request independently of a read request or write request for said memory cells;

a refresh control circuit delaying performance of said refresh until a read operation or write operation for said memory cells for said read request or write request is completed when the refresh request from said refresh request generator circuit collides with said read request or write request; and an address storing apparatus storing the present write request address, and an address hit control circuit making a comparison between the read request address and the write request address stored said address storing apparatus at the time of the previous write request, and outputting an address hit signal when the former and the latter match each other, wherein the write operation of performing said write operation is a late write operation of writing an access address and write data for a write request given in a memory cycle before a memory cycle for said write request, and wherein said semiconductor memory device has a page mode function, and is provided with said address storing apparatus and said address hit control circuit for each of a page address and an address other than said page address.

8. The semiconductor memory device according to claim 7, further comprising an address hit control circuit for page mode outputting a logical signal of an address hit signal of said page address and an address hit signal of the address other than said page address.

9. A semiconductor memory device having a memory cell array comprised of memory cells requiring refresh, the semiconductor memory device comprising:

a refresh request generator circuit generating a refresh request independently of a read request or write request for said memory cells; and a refresh control circuit delaying performance of said refresh until a read operation or write operation for said memory cells for said read request or write recquest is completed when the refresh request from said refresh request generator circuit collides with said read request or write request, wherein said refresh control circuit further comprises:

a one shot pulse generator circuit generating a one shot signal having one logic level in response to an address transition;

a latch circuit holding said one logic level of said one shot pulse;

a delay circuit delaying the output of said latch circuit by a predetermined time period;

a refresh request generator circuit generating a refresh request signal in response to said refresh request;

a refresh pulse generator circuit generating a timing control signal for the refresh operation in response to the output signal of said latch circuit and said refresh request signal; and a memory accessing pulse generator circuit generating a timing control signal for said read operation or write operation and a latch control signal based on the output signal of said latch circuit and the output signal of said delay circuit.

10. The semiconductor memory device according to claim 9, wherein said predetermined time period is set based on a refresh operation time period.

11. The semiconductor memory device according to claim 9, wherein said latch circuit is reset at the other logic level in response to said latch control signal.

12. The semiconductor memory device according to claim 9, wherein when the output signal of said latch circuit is at said one logic level, said refresh operation is prohibited, and said read request address or write request address is accessed.

13. The semiconductor memory device according to claim 11, wherein when the output signal of said latch circuit is at said other logic level, the refresh operation based on said refresh request is performed.

14. The semiconductor memory device according to claim 9, wherein said refresh request is generated from a refresh timer operating independently of said read request or write request.

15. The semiconductor memory device according to claim 9, further comprising other latch circuit holding said one logic level of the enable signal inputting said read request or write request; and a logic circuit inputting the output signal of said latch circuit and the output signal of said other latch circuit, wherein said refresh pulse generator circuit generates the timing control signal of the refresh operation in response to the output signal of said logic circuit and said refresh request signal, and said memory accessing pulse generator circuit generates the timing control signal of said read operation or write operation and the latch control signal based on the output signal of said logic circuit and the output signal of said delay circuit.

16. The semiconductor memory device according to claim 15, wherein said other latch circuit is reset at the other logic level in response to said latch control signal.

17. The semiconductor memory device according to claim 15, wherein when any one or both of the output signal of said latch circuit and the output of said other latch circuit are at said one logic level, said refresh operation is prohibited, and said read request address or write request address is accessed.

18. The semiconductor memory device according to claim 15, wherein when both of the output signal of said latch circuit and the output signal of said other latch circuit are at said other logic level, the refresh operation based on said refresh request is performed.

* * * * *